(12) United States Patent
Park et al.

(10) Patent No.: US 12,347,657 B2
(45) Date of Patent: Jul. 1, 2025

(54) PLASMA ETCHING APPARATUS, PLASMA ETCHING METHOD USING THE SAME, AND SEMICONDUCTOR FABRICATION METHOD USING THE SAME

(71) Applicant: SAMSUNG ELECTRONICS CO., LTD., Suwon-si (KR)

(72) Inventors: Jongchul Park, Seoul (KR); Sanghyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 291 days.

(21) Appl. No.: 17/893,783

(22) Filed: Aug. 23, 2022

(65) Prior Publication Data

US 2023/0187186 A1 Jun. 15, 2023

(30) Foreign Application Priority Data

Dec. 13, 2021 (KR) .................. 10-2021-0178083

(51) Int. Cl.
*H01J 37/32* (2006.01)
*H01L 21/311* (2006.01)
*H01L 21/3213* (2006.01)

(52) U.S. Cl.
CPC .. *H01J 37/32715* (2013.01); *H01J 37/32642* (2013.01); *H01L 21/31116* (2013.01); *H01L 21/31144* (2013.01); *H01L 21/32136* (2013.01); *H01L 21/32139* (2013.01); *H01J 2237/3341* (2013.01)

(58) Field of Classification Search
CPC .......... H01J 37/32715; H01J 37/32642; H01J 2237/3341; H01J 37/32091; H01J 37/32568; H01J 37/321; H01J 37/32082; H01J 37/3244; H01J 37/32174; H01J 15/00; H01J 37/32623; H01J 37/32009; H01J 37/32532; H01L 21/31116; H01L 21/31144; H01L 21/32136; H01L 21/32139; H01L 21/6831; H01L 21/68742; H01L 21/67069; H01L 21/0332; H01L 21/0337; H01L 21/68735; C23C 16/507; C23C 16/455; C23C 16/45591; C23C 16/4412; C23C 16/452; C23C 16/509; C23C 16/5096; C23C 16/45565

USPC ............. 118/723, 1, 723 IR, 723 E, 723 ER; 156/345.49, 45.48, 345.48, 345.43, 156/345.44, 345.45, 345.47

See application file for complete search history.

(56) References Cited

U.S. PATENT DOCUMENTS

| | | | | |
|---|---|---|---|---|
| 5,292,399 A | * | 3/1994 | Lee ................... | H01L 21/67069 156/345.47 |
| 6,057,235 A | * | 5/2000 | Leiphart ............. | C23C 16/4401 118/723 R |
| 6,375,860 B1 | * | 4/2002 | Ohkawa ............ | H01J 37/32697 156/345.46 |
| 6,471,830 B1 | * | 10/2002 | Moslehi ................ | C23C 14/358 204/192.12 |

(Continued)

*Primary Examiner* — Rudy Zervigon
(74) *Attorney, Agent, or Firm* — Sughrue Mion, PLLC

(57) ABSTRACT

A plasma etching apparatus includes a chuck configured to support a wafer, and a voltage application unit. The voltage application unit includes a first voltage application part configured to apply a first voltage to the wafer on the chuck, and a second voltage application part configured to apply a second voltage to the wafer on the chuck, the second voltage being different from the first voltage.

12 Claims, 22 Drawing Sheets

(56) References Cited

U.S. PATENT DOCUMENTS

| | | |
|---|---|---|
| 8,030,620 B2 | 10/2011 | Donnelly et al. |
| 8,338,307 B2 | 12/2012 | De Vries et al. |
| 10,157,750 B2 | 12/2018 | Terakura et al. |
| 10,248,026 B2 | 4/2019 | Ohtsu |
| 10,529,582 B2 | 1/2020 | Horiuchi |
| 2003/0201069 A1* | 10/2003 | Johnson ............ H01J 37/32082 156/345.43 |
| 2005/0173065 A1 | 8/2005 | Arita |
| 2019/0088520 A1* | 3/2019 | Kraus ............... H01J 37/32706 |
| 2020/0294812 A1 | 9/2020 | Kitagaito et al. |
| 2020/0395195 A1* | 12/2020 | Sanchez ............ H01L 21/67069 |
| 2021/0202262 A1 | 7/2021 | Nishide et al. |
| 2021/0351058 A1* | 11/2021 | Murakami ........ H01L 21/67115 |
| 2022/0254616 A1* | 8/2022 | Hudson ............. H01J 37/32715 |
| 2022/0375719 A1* | 11/2022 | Topping ................... H03H 7/38 |
| 2023/0352272 A1* | 11/2023 | Shoeb ............... H01J 37/32724 |

\* cited by examiner

PLASMA ETCHING APPARATUS, PLASMA ETCHING METHOD USING THE SAME, AND SEMICONDUCTOR FABRICATION METHOD USING THE SAME

CROSS-REFERENCE TO RELATED APPLICATION

This application is based on and claims priority under 35 U.S.C § 119 to Korean Patent Application No. 10-2021-0178083, filed on Dec. 13, 2021 in the Korean Intellectual Property Office, the disclosure of which is incorporated by reference herein in its entirety.

BACKGROUND

The present disclosure relates to a plasma etching apparatus, a plasma etching method using the same, and a semiconductor fabrication method using the same, and more particularly, to a plasma etching apparatus capable of preventing a mask from being etched, a plasma etching method using the same, and a semiconductor fabrication method using the same.

A semiconductor device may be fabricated through various processes. For example, a semiconductor device may be fabricated through a photolithography process, an etching process, and a deposition process on a substrate. A plasma may be used in an etching process for fabricating a semiconductor device. A plasma etching process may use an etching mask to form patterns. For example, the plasma may form holes on a substrate on which an etching mask is stacked.

SUMMARY

Some embodiments provide a plasma etching apparatus capable of preventing a mask from being etched, a plasma etching method using the same, and a semiconductor fabrication method using the same.

Some embodiments provide a plasma etching apparatus capable of increasing a yield in high-aspect ratio contact (HARC) etching, a plasma etching method using the same, and a semiconductor fabrication method using the same.

Some embodiments provide a plasma etching apparatus capable of achieving a fine-pitch etching, a plasma etching method using the same, and a semiconductor fabrication method using the same.

Additional aspects will be set forth in part in the description which follows and, in part, will be apparent from the description, or may be learned by practice of the presented embodiments.

According to an aspect of an example embodiment, a plasma etching apparatus may include a chuck configured to support a wafer, and a voltage application unit. The voltage application unit may include a first voltage application part configured to apply a first voltage to the wafer on the chuck, and a second voltage application part configured to apply a second voltage to the wafer on the chuck, the second voltage being different from the first voltage.

According to an aspect of an example embodiment, a plasma etching apparatus may include a chuck configured to support a wafer and a voltage application unit. The voltage application unit may include a first voltage delivery member configured to transmit a first direct current (DC) voltage to the wafer, and a first voltage source connected to the first voltage delivery member. The first voltage delivery member may be provided above the chuck.

According to an aspect of an example embodiment, a semiconductor fabrication method may include forming an etch-target layer on a substrate, forming a mask layer on the etch-target layer, patterning the mask layer, and etching the etch-target layer. Forming the mask layer may include forming a first electrode layer on the etch-target layer, and forming a dielectric layer on the first electrode layer. Patterning the mask layer may include patterning the dielectric layer so as to form a dielectric pattern hole in the dielectric layer. Etching the etch-target layer may include forming a plasma on the mask layer, and applying a first voltage to the first electrode layer.

According to an aspect of an example embodiment, a plasma etching method may include placing in a plasma etching apparatus a wafer in which a substrate, an etch-target layer, and a mask layer are sequentially stacked, forming a plasma on the wafer, and applying a voltage to the mask layer. When the voltage is applied to the mask layer, a particle of the plasma that passes through the mask layer may be accelerated toward the etch-target layer.

Details of other example embodiments are included in the description and drawings.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
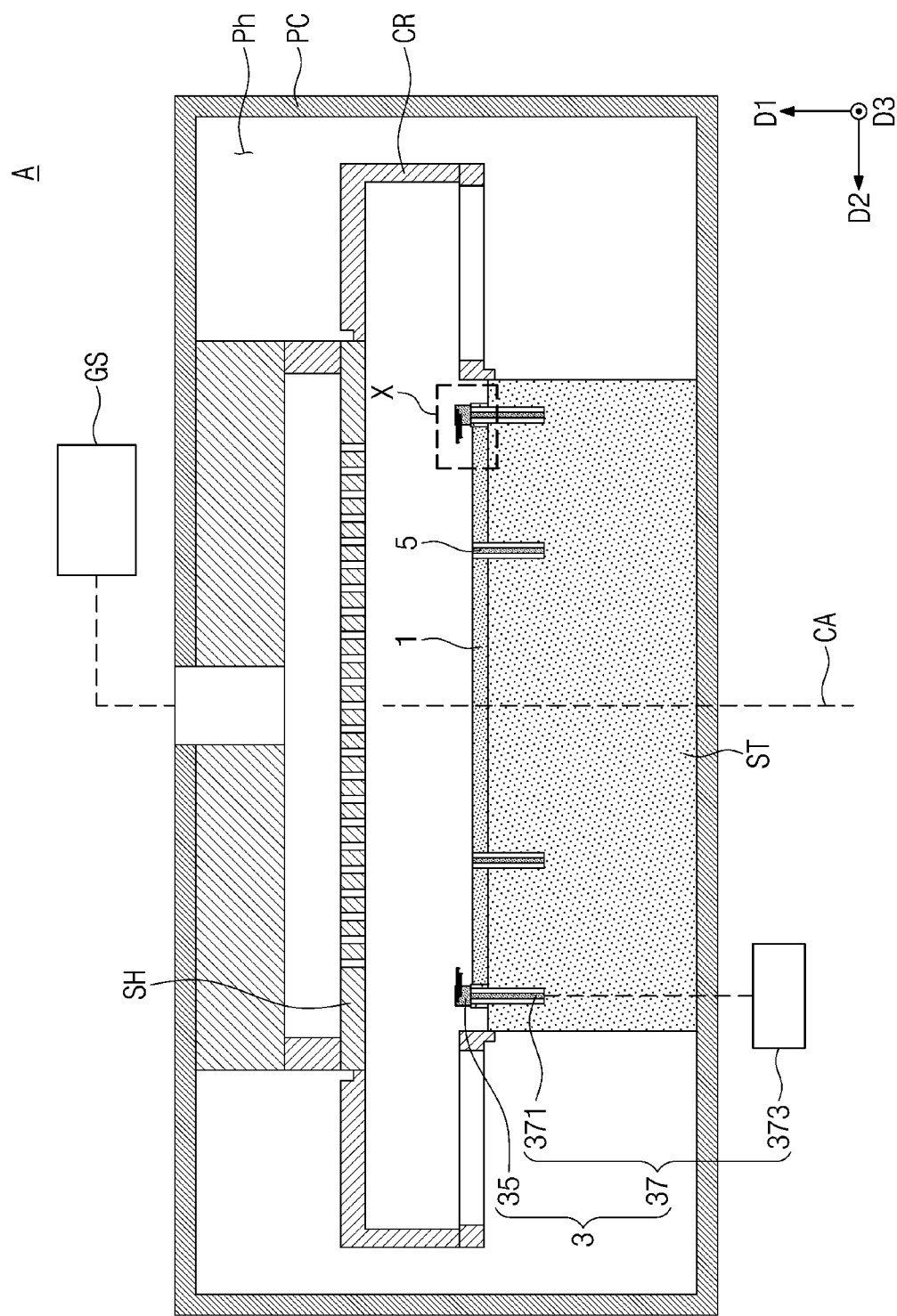
FIG. 1 is a cross-sectional view of a plasma etching apparatus according to an example embodiment.

The following will now describe some embodiments of the present disclosure with reference to the accompanying drawings. Like reference numerals may indicate like components throughout the description.

Figure 2:
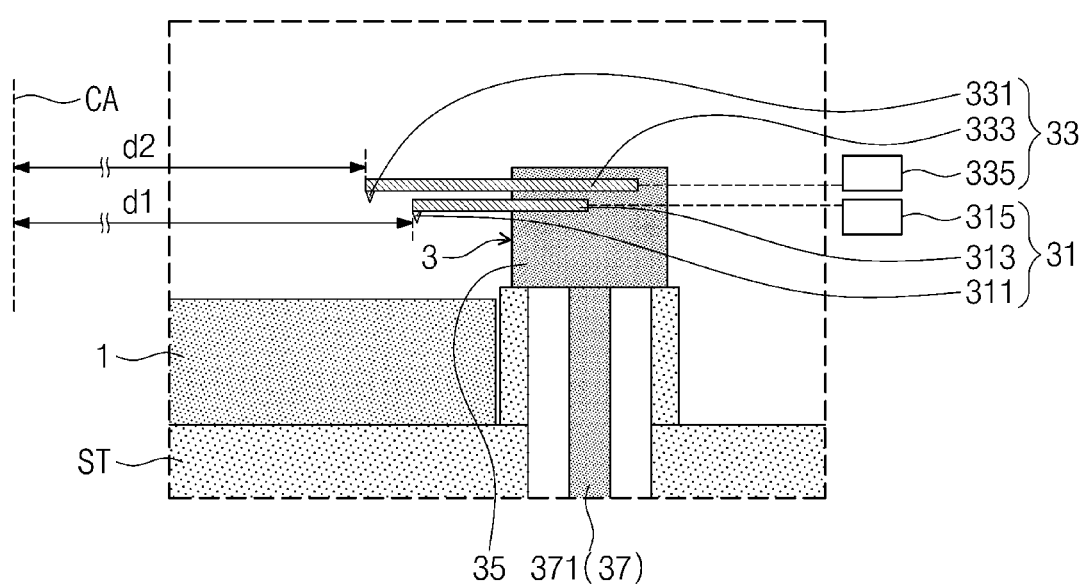
FIG. 2 is an enlarged cross-sectional view of section X of FIG. 1 according to an example embodiment.

FIG. 1 is a cross-sectional view of a plasma etching apparatus according to an example embodiment. FIG. 2 is an enlarged cross-sectional view of section X of FIG. 1 according to an example embodiment.

In this description, symbol D1 may indicate a first direction, symbol D2 may indicate a second direction that intersects the first direction D1, and symbol D3 may indicate a third direction that intersects each of the first and second directions D1 and D2. The first direction D1 may be referred to as an upward direction, and a direction reverse to the first direction D1 may be referred to as a downward direction. In addition, each of the second and third directions D2 and D3 may be referred to as a horizontal direction.

Referring to FIGS. 1 and 2, a plasma etching apparatus A may be provided. The plasma etching apparatus A may use plasma to etch one surface of a wafer. The plasma etching apparatus A may generate the plasma in various ways. For example, the plasma etching apparatus A may generate the plasma by using a capacitively coupled plasma (CCP) mode, an inductively coupled plasma (ICP) mode, or a magnetically enhanced reactive ion etching (MERIE) mode. Embodiments of the present disclosure, however, are not limited thereto, and the plasma etching apparatus A may etch a wafer in different ways. The following description will focus on the plasma etching apparatus A based on the CCP mode for the purpose of convenience of explanation.

The plasma etching apparatus A may include a process chamber PC, a gas supply unit GS, a showerhead SH, a stage ST, a confinement ring CR, a chuck 1, a wafer lift pin 5, and a voltage application unit 3.

The process chamber PC may provide a process space Ph. A wafer may be disposed in the process chamber PC. The wafer may be etched with the plasma in the process space Ph.

The gas supply unit GS may supply the process chamber PC with a process gas. The gas supply unit GS may include a gas tank, a compressor, and a pipe line. The gas supply unit GS may include a plurality of gas supply units. The plurality of gas supply units GS may supply many kinds of process gases. For convenience, the following will describe a single gas supply unit GS.

The showerhead SH may be positioned in the process chamber PC. The showerhead SH may distribute the process gas supplied onto the showerhead SH by the gas supply unit GS. The process gas may pass through the showerhead SH and then may be distributed over the chuck 1. In some embodiments, the showerhead SH may serve as a top electrode.

The stage ST may support the chuck 1. The stage ST may have therein a bottom electrode, a heater, a cooling passage, a radio-frequency (RF) power delivery member, and so forth.

The confinement ring CR may surround the stage ST. The confinement ring CR may separate a space above the stage ST from another space. The confinement ring CR may limit a position of the plasma formed on the stage ST.

The chuck 1 may support the wafer. The chuck 1 may rigidly place the wafer into a certain position on the chuck 1. For example, the chuck 1 may use an electrostatic force to fix the wafer to a certain position. In some embodiments, the chuck 1 may be an electrostatic chuck (ESC). Embodiments of the present disclosure, however, are not limited thereto, and the chuck 1 may be a vacuum chuck or a physical sticky chuck. The wafer may be etched in a state while being fixed onto the chuck 1. The chuck 1 may have a plate shape that extends in a horizontal direction. For example, the chuck 1 may have a disk shape around an axis CA that extends in the first direction D1. Embodiments of the present disclosure, however, are not limited thereto, and the chuck 1 may have any other suitable shapes. The chuck 1 will be further discussed in detail below.

The wafer lift pin 5 may be positioned below the chuck 1. The wafer lift pin 5 may have a rod shape that extends in the first direction D1. The wafer lift pin 5 may move the wafer upwardly or downwardly. For example, the wafer lift pin 5 may descend while supporting the wafer to allow the chuck 1 to receive the wafer thereon. In addition, the wafer lift pin 5 may rise the wafer disposed on the chuck 1 to allow the wafer to ascend from the chuck 1. The wafer lift pin 5 may include a plurality of pins. For example, three wafer lift pins 5 may be provided. The three wafer lift pins 5 may be spaced apart from each other in a horizontal direction. For convenience, the following will describe a single wafer lift pin 5.

The voltage application unit 3 may apply a voltage to the wafer disposed on the chuck 1. For example, the voltage application unit 3 may apply a direct current (DC) voltage to the wafer. The voltage application unit 3 will be further discussed in detail with reference to FIGS. 2 to 4.

Alternatively, the plasma etching apparatus A may further include a focus ring. The focus ring may be positioned inside the confinement ring CR. For example, the focus ring may be positioned between the voltage application unit 3 and the wafer disposed on the chuck 1. Alternatively, the focus ring may vertically overlap a portion of the voltage application unit 3. Dissimilarly, the focus ring may be positioned outside the voltage application unit 3. In some embodiments, the focus ring may be omitted, and a portion of the voltage application unit 3 may serve as a focus ring.

Figure 3:
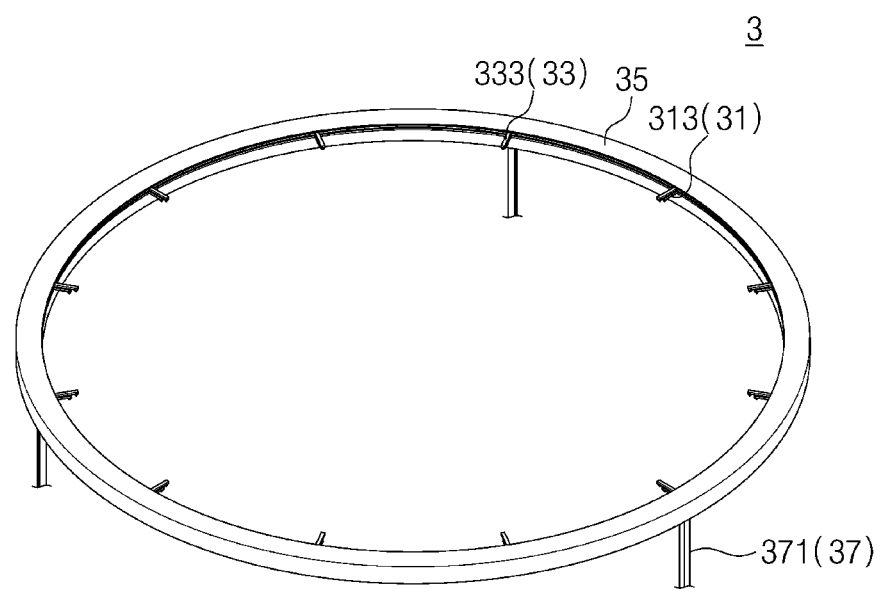
FIG. 3 is a perspective view of a voltage application unit according to an example embodiment.
Figure 3:
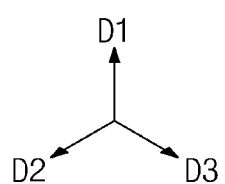
Figure 4:
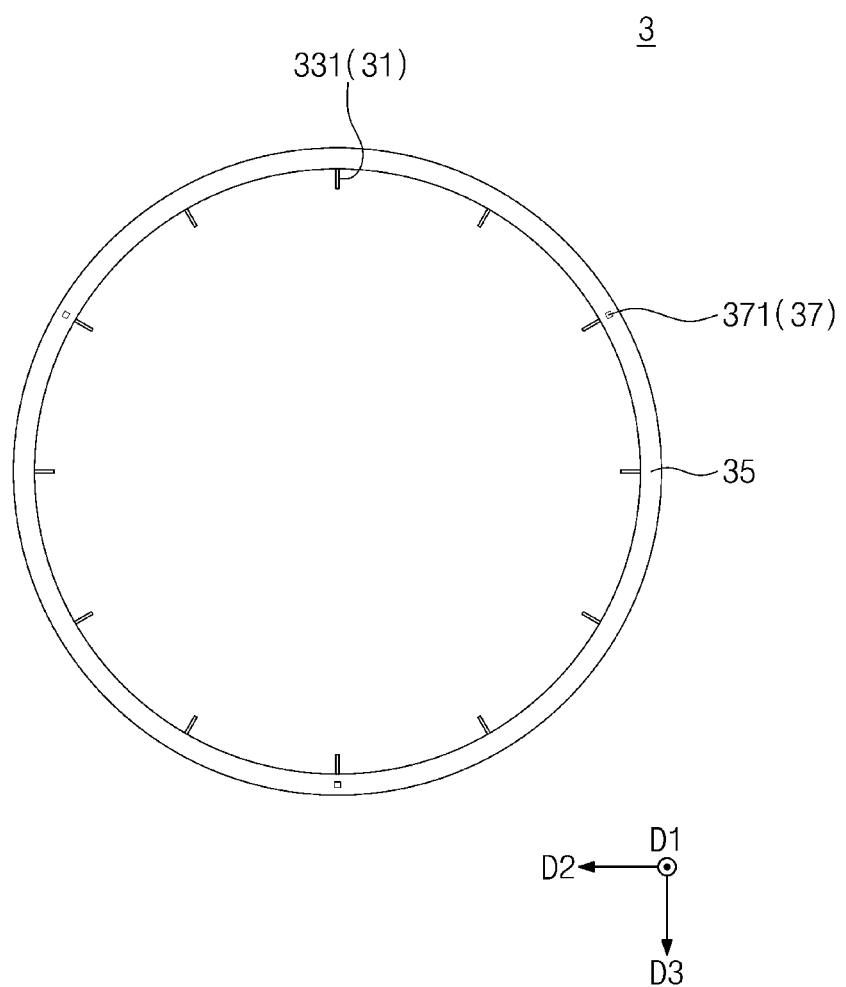
FIG. 4 is a plan view of a voltage application unit according to an example embodiment.

FIG. 3 is a perspective view of a voltage application part according to an example embodiment. FIG. 4 is a plan view of a voltage application unit according to an example embodiment.

Referring to FIGS. 2-4, the voltage application unit 3 may include a first voltage application part 31, a second voltage application part 33, an edge ring 35, and an elevation drive part 37.

The first voltage application part 31 may apply a first voltage to the wafer disposed on the chuck 1. The first voltage may be a positive DC voltage. The first voltage application part 31 may use various ways to apply the first voltage to the wafer. For example, the first voltage application part 31 may apply the first voltage to the wafer, while being in contact with one side at a top surface of the wafer. The first voltage application part 31 may include a first voltage delivery member 311, a first support member 313, and a first voltage source 315.

The first voltage delivery member 311 may be positioned above the chuck 1. For example, in a state where the wafer is disposed on the chuck 1, the first voltage delivery member 311 may be disposed above the chuck 1 to contact the one side at the top surface of the wafer. Embodiments of the present disclosure, however, are not limited thereto, and at the time when no process is performed, the first voltage delivery member 311 may be positioned below the chuck 1 or on a side of the chuck 1. The first voltage delivery member 311 may vertically extend. For example, the first voltage delivery member 311 may have a tip shape that tapers in a downward direction, but embodiments of the present disclosure are not limited thereto. The first voltage delivery member 311 may include a conductive material for delivering a voltage. For example, the first voltage delivery member 311 may include a metallic material. A first distance d1 may be defined to indicate a horizontal distance between the first voltage delivery member 311 and the axis CA of the chuck 1. A detailed description thereof will be further discussed below.

The first support member 313 may support the first voltage delivery member 311. The first support member 313 may have a rod shape that extends in a horizontal direction. The first support member 313 may be supported by the edge ring 35. The first voltage may be transmitted through the first support member 313 to the first voltage delivery member 311.

The first voltage source 315 may generate the first voltage. The first voltage source 315 may be electrically connected to the first voltage delivery member 311. For example, the first voltage source 315 may generate a positive DC voltage, and may transmit the positive DC voltage to the first voltage delivery member 311 through the first support member 313.

The second voltage application part 33 may apply a second voltage to the wafer disposed on the chuck 1. The second voltage may be a negative DC voltage. The second voltage application part 33 may use various ways to apply the second voltage to the wafer. For example, the second voltage application part 33 may apply the second voltage to the wafer, while being in contact with another side at the top surface of the wafer. The second voltage application part 33 may include a second voltage delivery member 331, a second support member 333, and a second voltage source 335.

The second voltage delivery member 331 may be positioned above the chuck 1. For example, in a state where the wafer is disposed on the chuck 1, the second voltage delivery member 331 may be disposed above the chuck 1 to contact the other side at the top surface of the wafer. Embodiments of the present disclosure, however, are not limited thereto, and at the time when no process is performed, the second voltage delivery member 331 may be positioned below the chuck 1 or on a side of the chuck 1. The second voltage delivery member 331 may vertically extend. For example, the second voltage delivery member 331 may have a tip shape that tapers in a downward direction, but embodiments of the present disclosure are not limited thereto. The second voltage delivery member 331 may include a conductive material for delivering a voltage. For example, the second voltage delivery member 331 may include a metallic material. A second distance d2 may be defined to indicate a horizontal distance between the second voltage delivery member 331 and the axis CA of the chuck 1. A detailed description thereof will be further discussed below.

The second support member 333 may support the second voltage delivery member 331. The second support member 333 may have a rod shape that extends in a horizontal direction. The second support member 333 may be supported by the edge ring 35. The second voltage may be transmitted through the second support member 333 to the second voltage delivery member 331.

The second voltage source 335 may generate the second voltage. The second voltage source 335 may be electrically connected to the second voltage delivery member 331. For example, the second voltage source 335 may generate a negative DC voltage, and may transmit the negative DC voltage to the second voltage delivery member 331 through the second support member 333. The second voltage source 335 may be connected to the first voltage source 315. For example, the second voltage source 335 and the first voltage source 315 may be provided in the shape of a single unitary piece.

The first voltage delivery member 311 may be positioned outwardly further than the second voltage delivery member 331. For example, the first distance d1 may be greater than the second distance d2. A difference between the first and second distances d1 and d2 may range from about 0.1 mm to about 10 mm. For example, the first distance d1 may be about 0.5 mm to about 5 mm greater than the second distance d2. The first distance d1 may range, for example, from about 148 mm to about 150 mm. The second distance d2 may range, for example, from about 138 mm to about 149 mm Embodiments of the present disclosure, however, are not limited thereto, and the first and second distances d1 and d2 may be changed in accordance with a detailed design.

The second voltage delivery member 331 may be positioned above the first voltage delivery member 311. For example, the second voltage delivery member 331 may have a bottom end located higher than that of the first voltage delivery member 311.

The edge ring 35 may be positioned outside the chuck 1. For example, when viewed in plan, the edge ring 35 may surround the chuck 1. The edge ring 35 may support the first voltage delivery member 311 and the second voltage delivery member 331. For example, the edge ring 35 may support the first support member 313 and the first voltage delivery member 311. In addition, the edge ring 35 may support the second support member 333 and the second voltage delivery member 331.

The elevation drive part 37 may drive the first voltage delivery member 311 and the second voltage delivery member 331 to vertically move relative to the chuck 1. For example, the elevation drive part 37 may rise the edge ring 35 to upwardly move one or more of the first voltage delivery member 311 and the second voltage delivery member 331 that are supported by the edge ring 35. The elevation drive part 37 may include an outer lift pin 371 and an elevation mechanism (see 373 of FIG. 1). The outer lift pin 371 may have a rod shape that vertically extends. The outer lift pin 371 may be in contact with a bottom surface of the edge ring 35. A portion of the outer lift pin 371 may be inserted into the stage ST. The elevation mechanism 373 may be connected to the outer lift pin 371. The elevation mechanism 373 may drive the outer lift pin 371 to move vertically. When the outer lift pin 371 moves vertically, the edge ring 35 on the outer lift pin 371 may also move vertically.

Referring to FIGS. 3 and 4, the first support member 313 and the first voltage delivery member (see 311 of FIG. 2) may each include a plurality of first support members and a plurality of first delivery members, respectively. The plurality of first support members 313 may be disposed spaced apart from each other in a circumferential direction. Therefore, the plurality of first voltage delivery members 311 may also be disposed spaced apart from each other in the circumferential direction. The second support member 333 and the second voltage delivery member (see 331 of FIG. 2) may each include a plurality of second support members and a plurality of second delivery members, respectively. The plurality of second support members 333 may be disposed spaced apart from each other in the circumferential direction. Therefore, the plurality of second voltage delivery members 331 may also be disposed spaced apart from each other in the circumferential direction. For convenience, the following will describe a single first voltage delivery member 311, a single first support member 313, a single second voltage delivery member 331, and a single second support member 333.

The outer lift pin 371 may include a plurality of pins. For example, three outer lift pins 371 may be provided. When viewed in plan, the three outer lift pins 371 may be disposed spaced apart from each other to constitute three vertices of a triangle. For convenience, the following will describe a single outer lift pin 371.

Figure 5A:
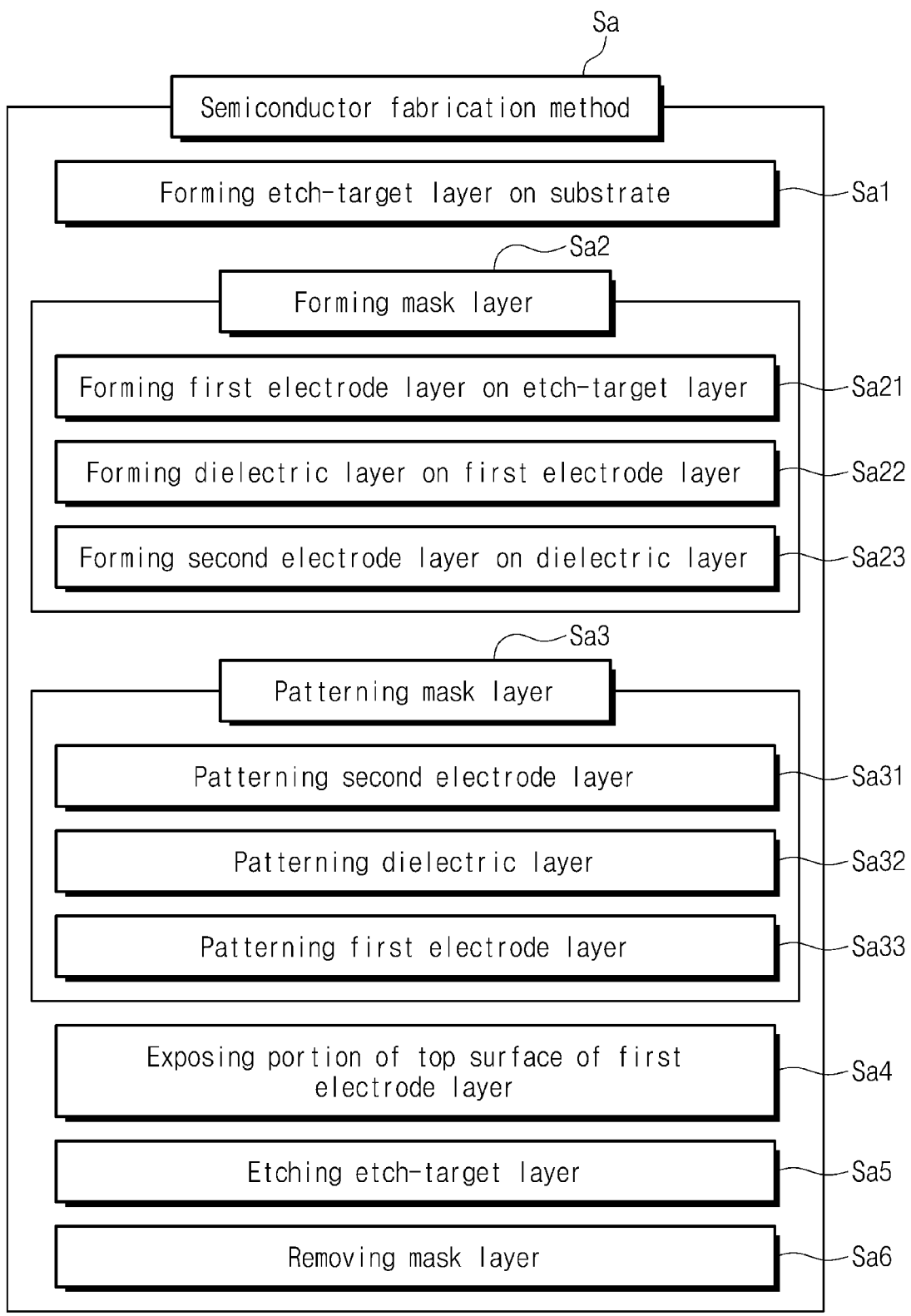
FIG. 5A is a flowchart of a semiconductor fabrication method according to an example embodiment.

FIG. 5A is a flowchart of a semiconductor fabrication method according to an example embodiment.

Referring to FIG. 5A, a semiconductor fabrication method Sa may be provided. The semiconductor fabrication method Sa may include an operation Sa1 of forming an etch-target layer on a substrate, an operation Sa2 of forming a mask layer, an operation Sa3 of patterning the mask layer, an operation Sa4 of partially exposing a top surface of a first electrode layer, an operation Sa5 of etching the etch-target layer, and an operation Sa6 of removing the mask layer.

Figure 5B:
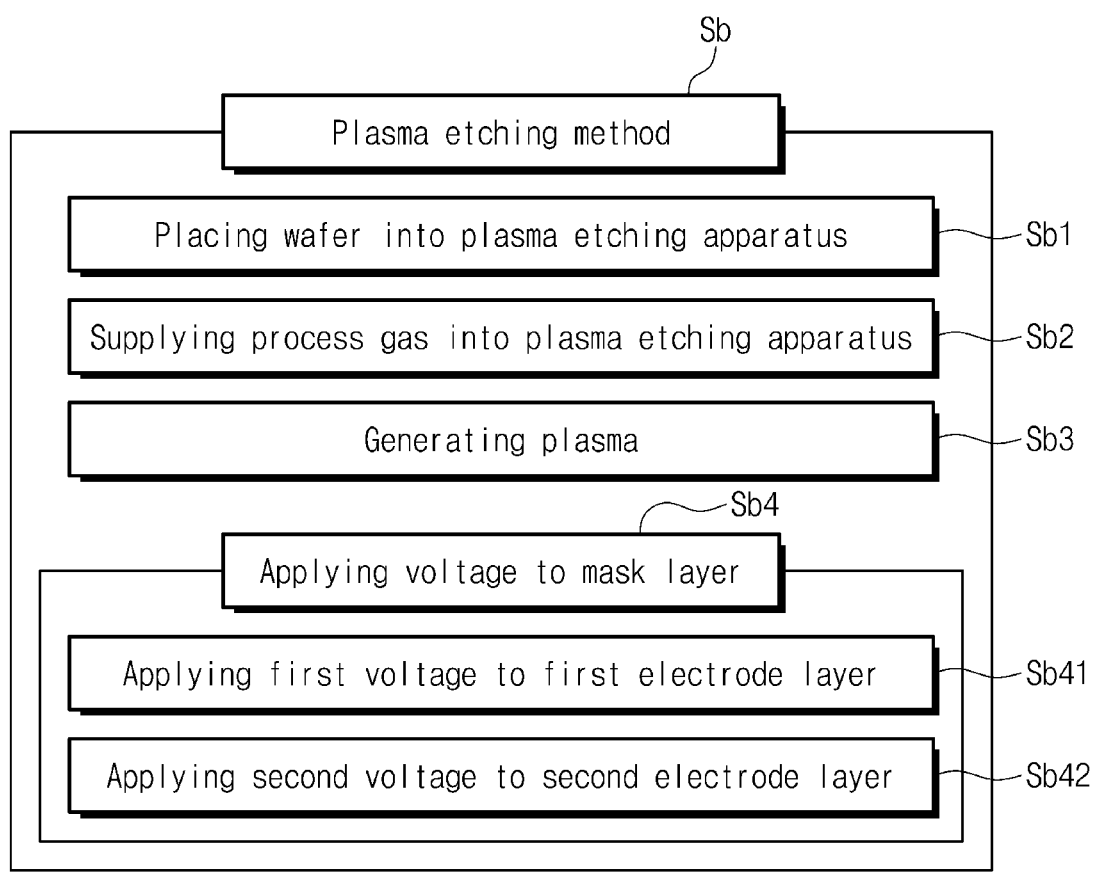
FIG. 5B is a flowchart of a plasma etching method according to an example embodiment.

The etching operation Sa5 may be performed by a plasma etching method (see Sb of FIG. 5B). This will be further discussed in detail with reference to FIG. 5B.

FIG. 5B is a flowchart of a plasma etching method according to an example embodiment.

Referring to FIG. 5B, a plasma etching method Sb may be provided. The plasma etching method Sb may refer to a detailed method of the etching operation Sa5 in the semiconductor fabrication method Sa discussed with reference to FIG. 5A. The plasma etching method Sb may provide a wafer etching method by using the plasma etching apparatus (see A of FIG. 1) discussed with reference to FIGS. 1 to 4. The plasma etching method Sb may include an operation Sb1 of placing a wafer into a plasma etching apparatus, an operation Sb2 of supplying a process gas into the plasma etching apparatus, and an operation Sb3 of generating plasma, and an operation Sb4 of applying a voltage to the mask layer.

The voltage apply operation Sb4 may include an operation Sb41 of applying a first voltage to a first electrode layer and an operation Sb42 of applying a second voltage to a second electrode layer.

With reference to FIGS. 6 to 20, the following will describe in detail the semiconductor fabrication method Sa and the plasma etching method Sb according to the flowcharts of FIGS. 5A and 5B, respectively.

FIGS. 6, 7, 8, 9, 10, 11, 12, 13, 14, 15, 16, 17, 18, 19 and 20 illustrate cross-sectional views showing a semiconductor fabrication method according to the flowchart of FIG. 5A and a plasma etching method according to the flowchart of FIG. 5B, according to an embodiment.

Figure 6:
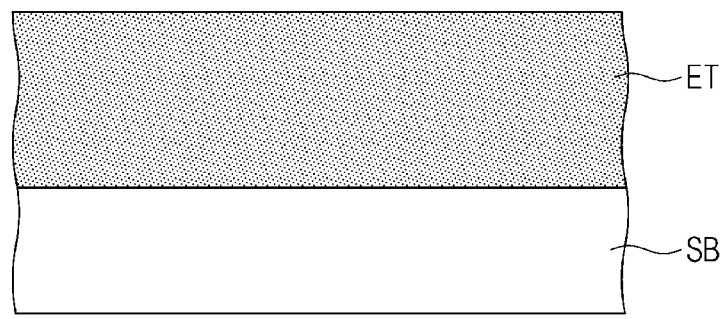
FIGS. 6, 7, 8, 9, 10, 11, 12, 13, 14, 15, 16, 17, 18, 19 and 20 illustrate cross-sectional views showing a semiconductor fabrication method according to the flowchart of FIG. 5A and a plasma etching method according to the flowchart of FIG. 5B, according to an embodiment.

Referring to FIGS. 5A and 6, the etch-target layer formation operation Sa1 may include stacking an etch-target layer ET on a substrate SB. The substrate SB may include a silicon substrate, a germanium substrate, a silicon-on-insulator (SOI) substrate, or a germanium-on-insulator (GOI) substrate. The etch-target layer ET may include a conductive material or a dielectric material. The conductive material may include at least one selected from semiconductor materials (doped silicon, doped germanium, etc.), conductive metal nitrides (titanium nitride, tantalum nitride, etc.), metals (tungsten, titanium, tantalum, etc.), metal-semiconductor compounds (tungsten silicide, cobalt silicide, titanium silicide, etc.). The dielectric material may include at least one selected from a silicon oxide layer, a silicon nitride layer, and a silicon oxynitride layer.

Figure 7:
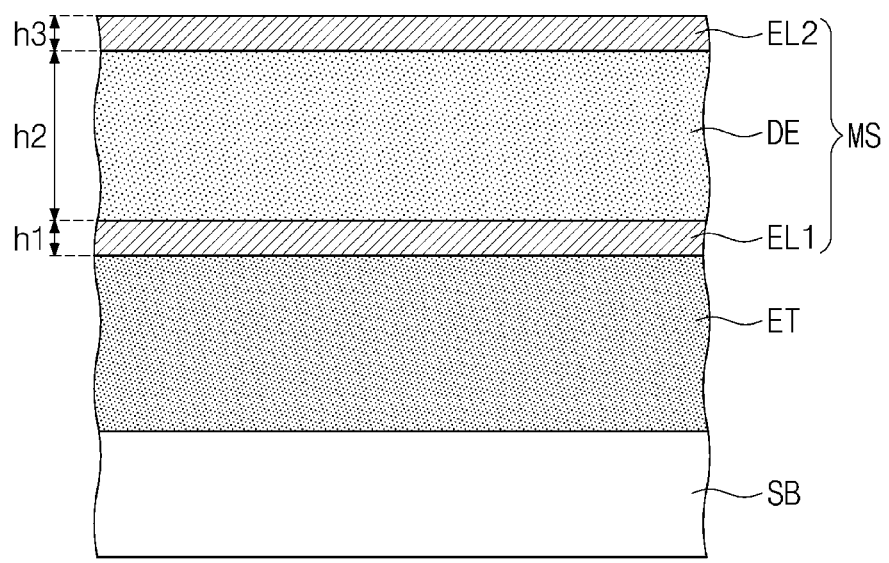

Referring to FIGS. 5A and 7, the mask layer formation operation Sa2 may include an operation Sa21 of forming a first electrode layer on the etch-target layer, an operation Sa22 of forming a dielectric layer on the first electrode layer, and an operation Sa23 of forming a second electrode layer on the dielectric layer. A first electrode layer EL1 may be formed on the etch-target layer ET. The first electrode EL1, a dielectric layer DE, and a second electrode layer EL2 may be integrally constitute a mask layer MS.

The first electrode layer EL1 may include a conductive material. For example, the first electrode layer EL1 may include a metallic material. For more detail, the first electrode layer EL1 may include at least one selected from tungsten (W), cobalt (Co), molybdenum (Mo), aluminum (Al), and copper (Cu). The first electrode layer EL1 may have a thickness h1 of about 5 nm to about 500 nm, but embodiments of the present disclosure are not limited thereto.

The dielectric layer DE may include a dielectric material. For example, the dielectric layer DE may include silicon oxide. The dielectric layer DE may be thicker than the first electrode layer EL1. For example, the dielectric layer DE may have a thickness h2 of about 0.1 μm to about 10 μm.

The second electrode layer EL2 may include a conductive material. For example, the second electrode layer EL2 may include a material substantially the same as or similar to that of the first electrode layer EL1. The second electrode layer EL2 may be thinner than the dielectric layer DE. For example, the second electrode layer EL2 may have a thickness h3 substantially the same as or similar to the thickness h1 of the first electrode layer EL1.

Figure 8:
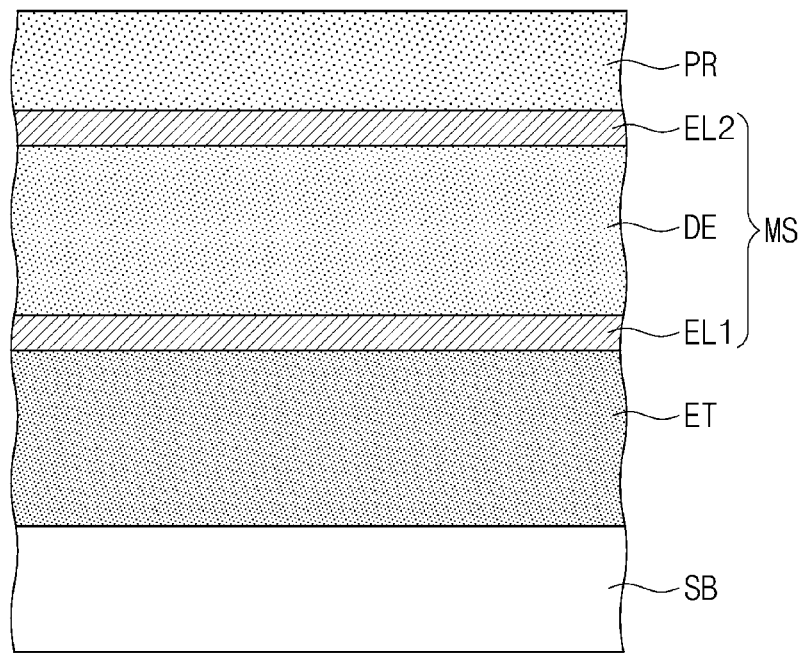

Referring to FIGS. 5A and 8, the patterning operation Sa3 may include an operation Sa31 of patterning the second electrode layer, an operation Sa32 of patterning the dielectric layer, and an operation Sa33 of patterning the first electrode layer. A photoresist layer PR may be coated on the mask layer MS. The photoresist layer PR may be coated by spin coating, but embodiments of the present disclosure are not limited thereto.

Figure 9:
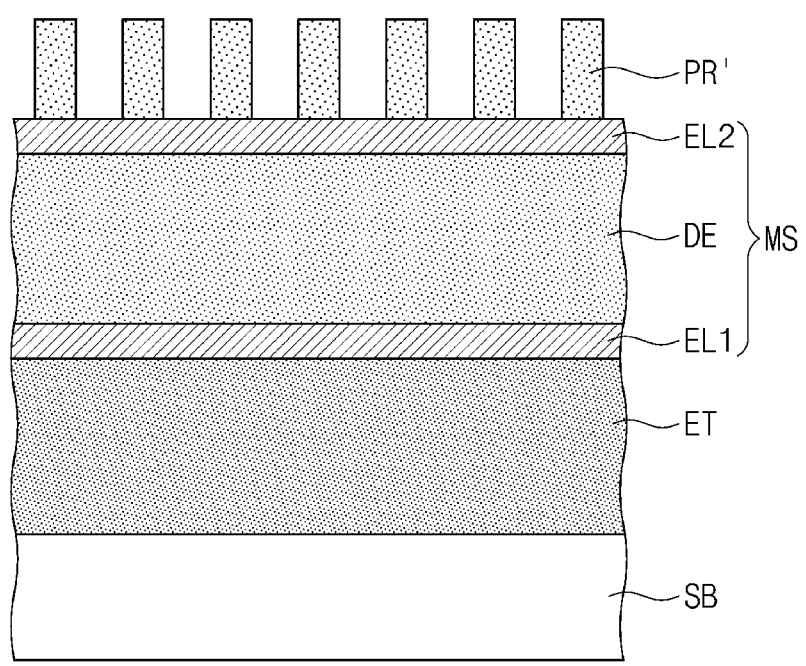

Referring to FIG. 9, a patterned photoresist layer PR may be formed. For example, exposure and development processes may be used to form the patterned photoresist layer PR'. Therefore, a top surface of the mask layer MS may be partially exposed.

Figure 10:
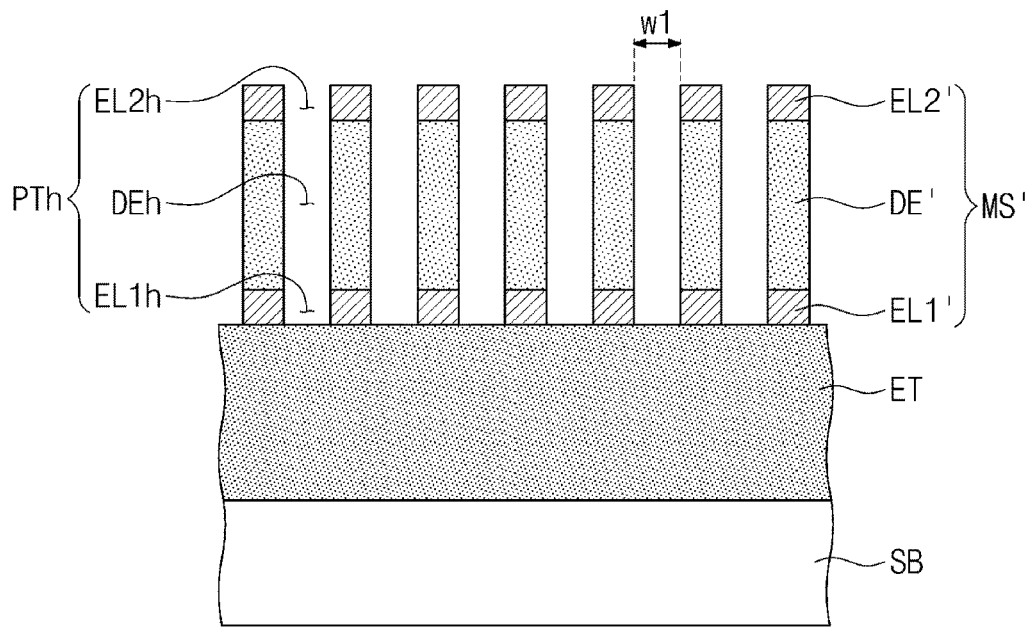

Referring to FIG. 10, the patterned photoresist layer PR' may be used to form a patterned mask layer MS'. An etching process may be performed to form the patterned mask layer MS'. For example, a patterned first electrode layer EL1' may be formed to provide a bottom-electrode pattern hole EL1$h$. The patterned first electrode layer EL1' may be referred to as a first electrode pattern. In addition, a patterned electrode layer DE' may be formed to provide a dielectric pattern hole DE$h$. The patterned dielectric layer DE' may be referred to as a dielectric pattern. In addition, a patterned second electrode layer EL2' may be formed to provide a top-electrode pattern hole EL2$h$. The patterned mask layer MS' may be referred to as a mask pattern. The bottom-electrode pattern hole EL1$h$, the dielectric pattern hole DE$h$, and the top-electrode pattern hole EL2$h$ may be connected to each other. A pattern hole PT$h$ may be constituted by the bottom-electrode pattern hole EL1$h$, the dielectric pattern hole DE$h$, and the top-electrode pattern hole EL2$h$. The pattern hole PT$h$ may have a diameter w1 of equal to or less than about 0.5 nm, but embodiments of the present disclosure are not limited thereto.

Figure 11:
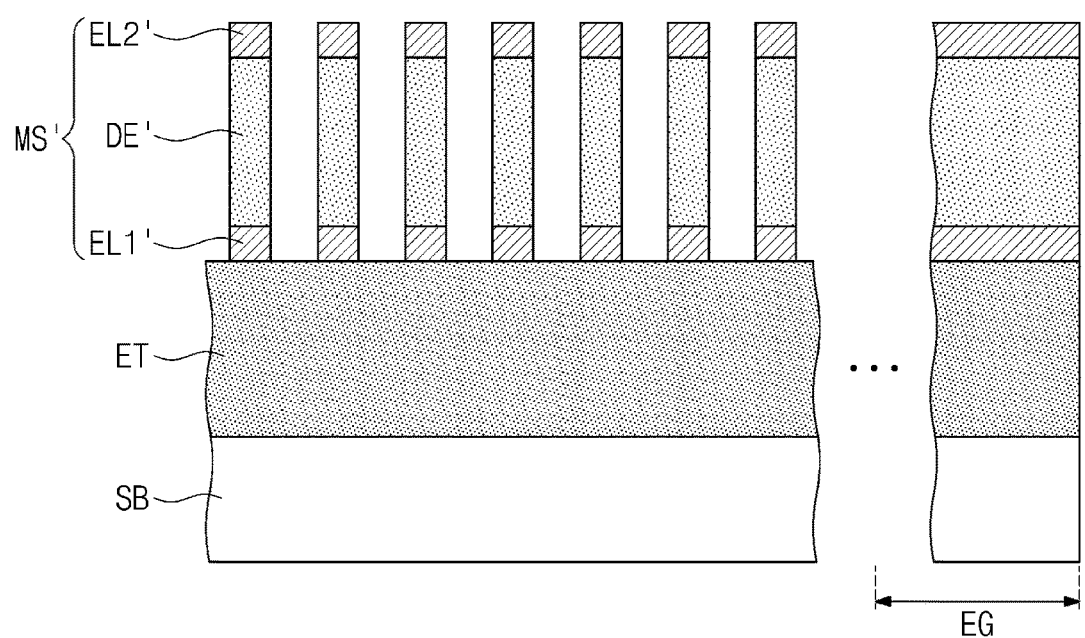
Figure 12:
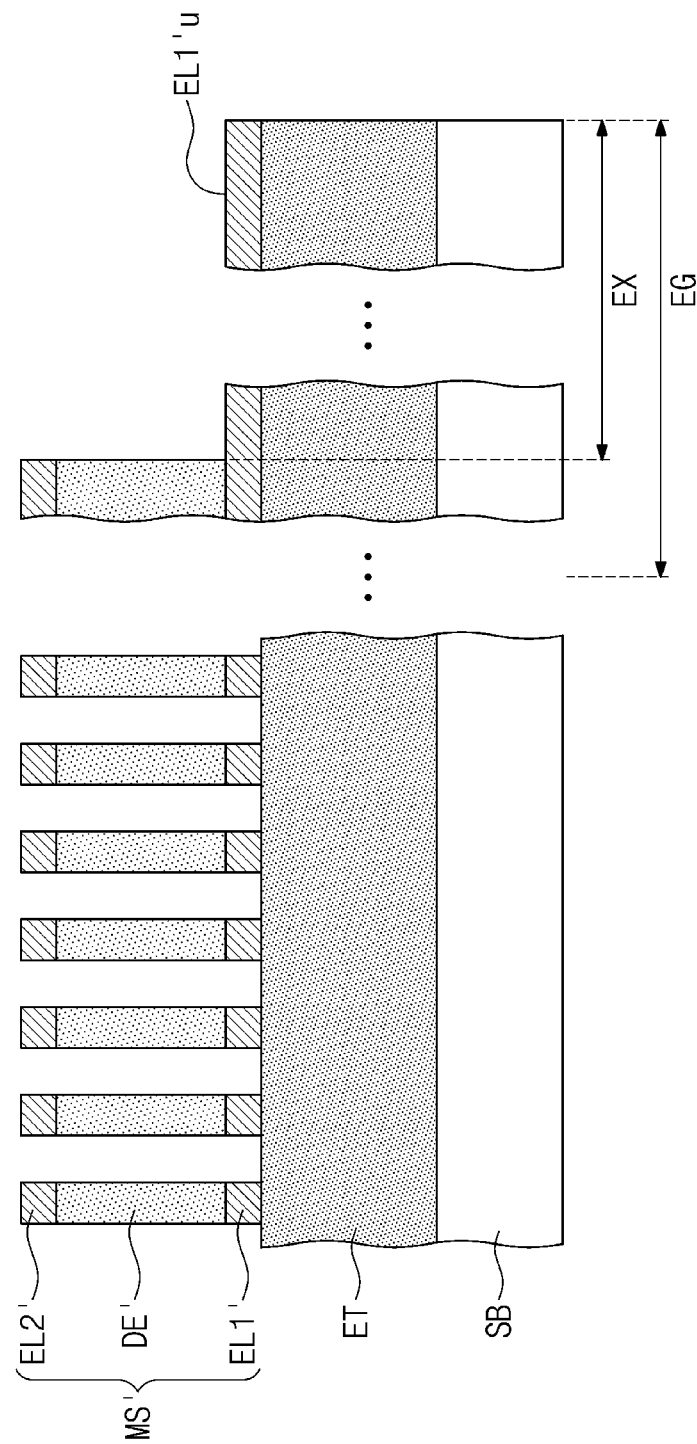

Referring to FIGS. 5A, 11, and 12, the exposure operation Sa4 may include exposing a portion of the first electrode layer EL1' on an edge region EG. For example, on the edge region EG, the second electrode layer EL2' and the dielectric layer DE' may be partially removed to expose a portion of the first electrode layer EL1'. An exposure region EX may be defined to indicate an exposed area at a top surface EL1'$u$ of the first electrode layer EL1'. The exposure region EX may have a length of about 0.5 mm to about 5 mm in a radius direction. For example, the exposure region EX may have a length of about 0.5 mm to about 2 mm in a radius direction. The exposure operation Sa4 may be performed by an etching process. For example, the exposure operation Sa4 may be executed simultaneously with the patterning operation Sa3. Embodiments of the present disclosure, however, are not limited thereto, and the exposure operation Sa4 may be processed separately followed by the patterning operation Sa3.

Figure 13:
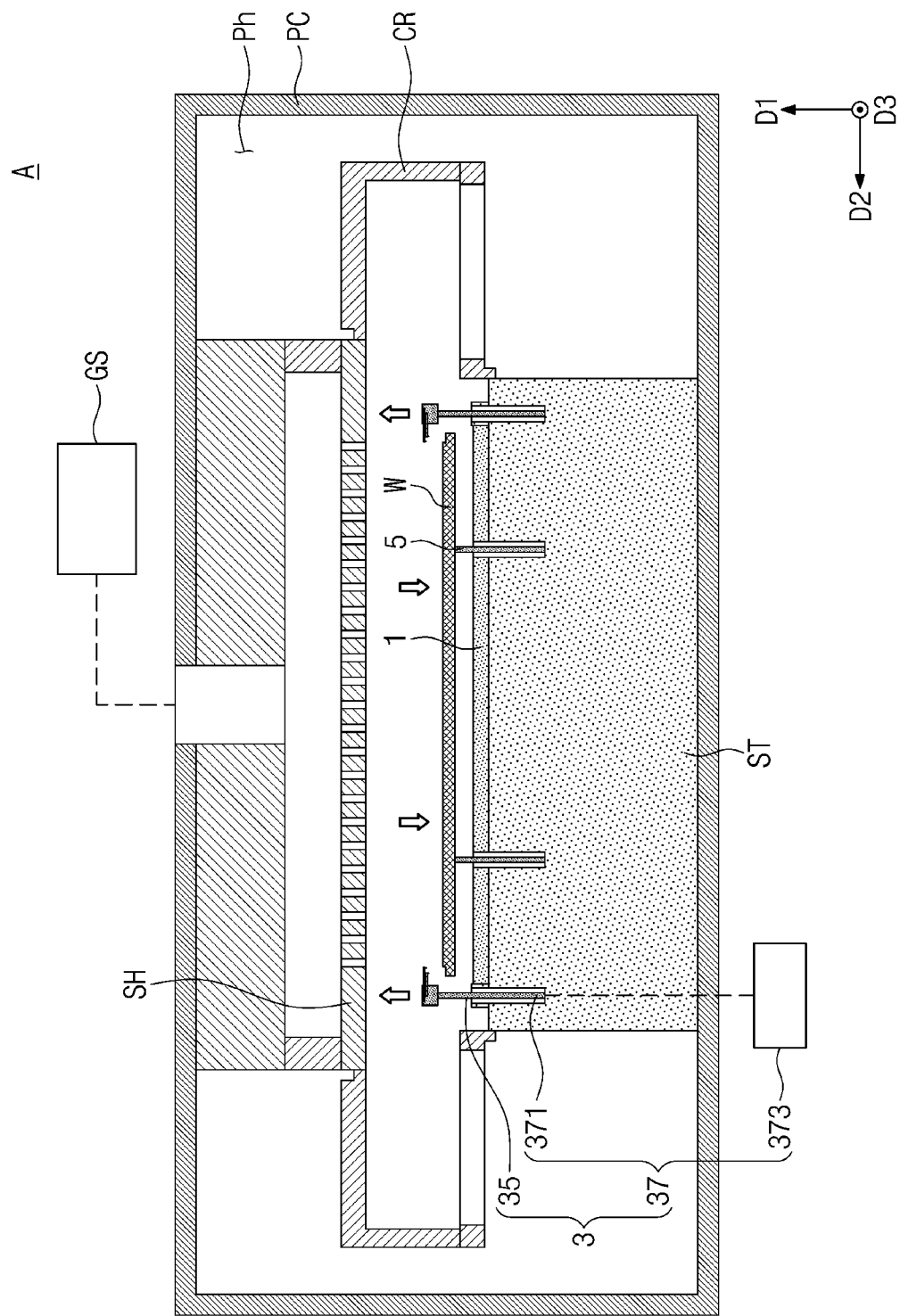

Referring to FIGS. 5B and 13, the wafer placement operation Sb1 may include placing a wafer W on the chuck 1. The wafer W may mean a component discussed with reference to FIG. 12. For example, the wafer W may be configured such that the substrate SB, the etch-target layer ET, and the mask layer MS' are sequentially stacked. The wafer W may be disposed on the wafer lift pin 5 that projects upwardly from the chuck 1. In this case, the edge ring 35 may be in a raised state by the outer lift pin 371. Therefore, without being interrupted by the voltage application unit 3, the wafer W may be disposed on the wafer lift pin 5.

Figure 14:
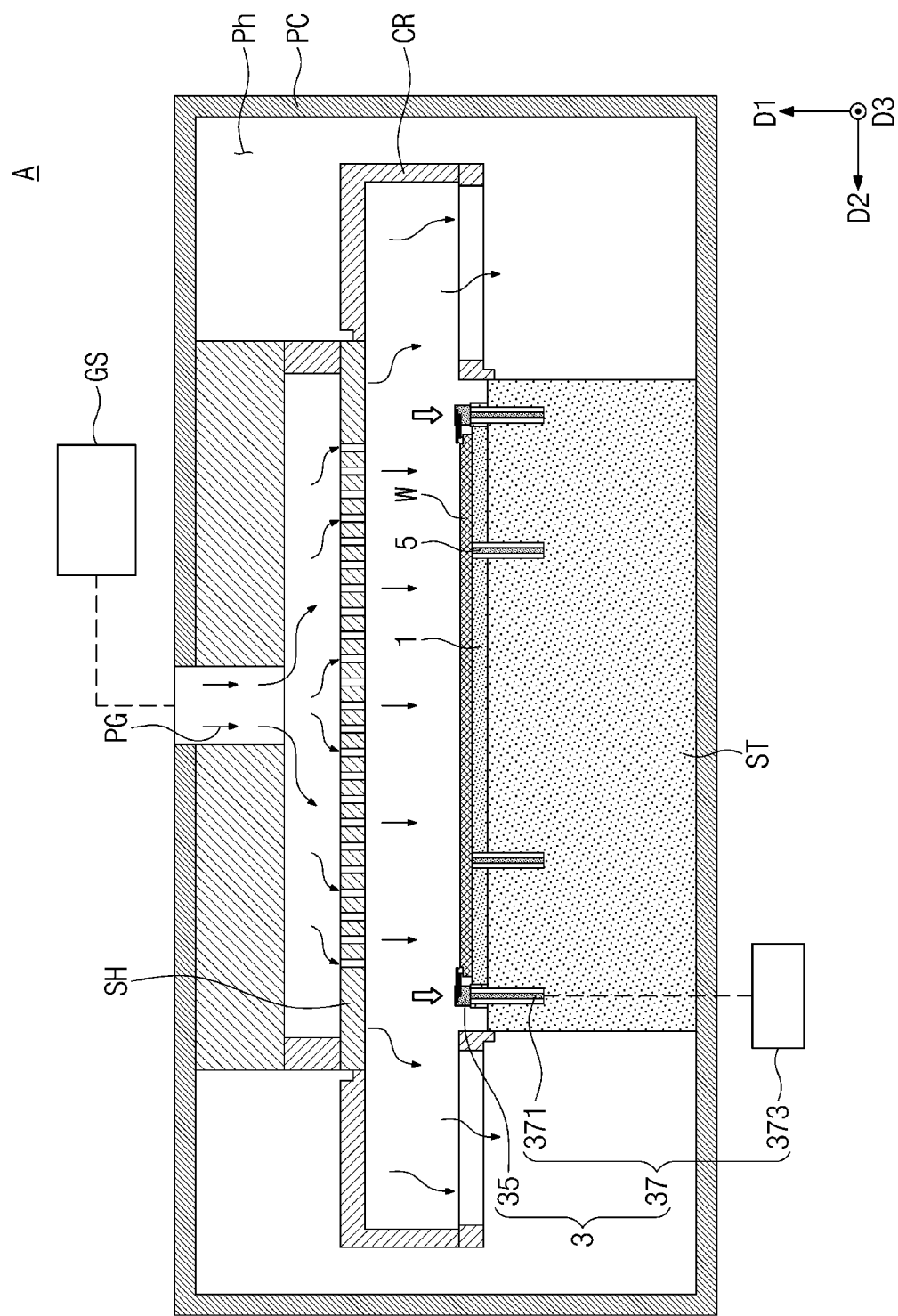

Referring to FIGS. 5B and 14, the descent of the wafer lift pin 5 may allow the wafer W to rest on the chuck 1. The chuck 1 may use an electrostatic force to rigidly place the wafer W into a certain position thereon. When the wafer W is disposed on the chuck 1, the edge ring 35 may descend. The process gas supply operation Sb2 may include allowing the gas supply unit GS to supply the process chamber PC with a process gas PG. The showerhead SH may distribute the process gas PG onto the wafer W.

Figure 15:
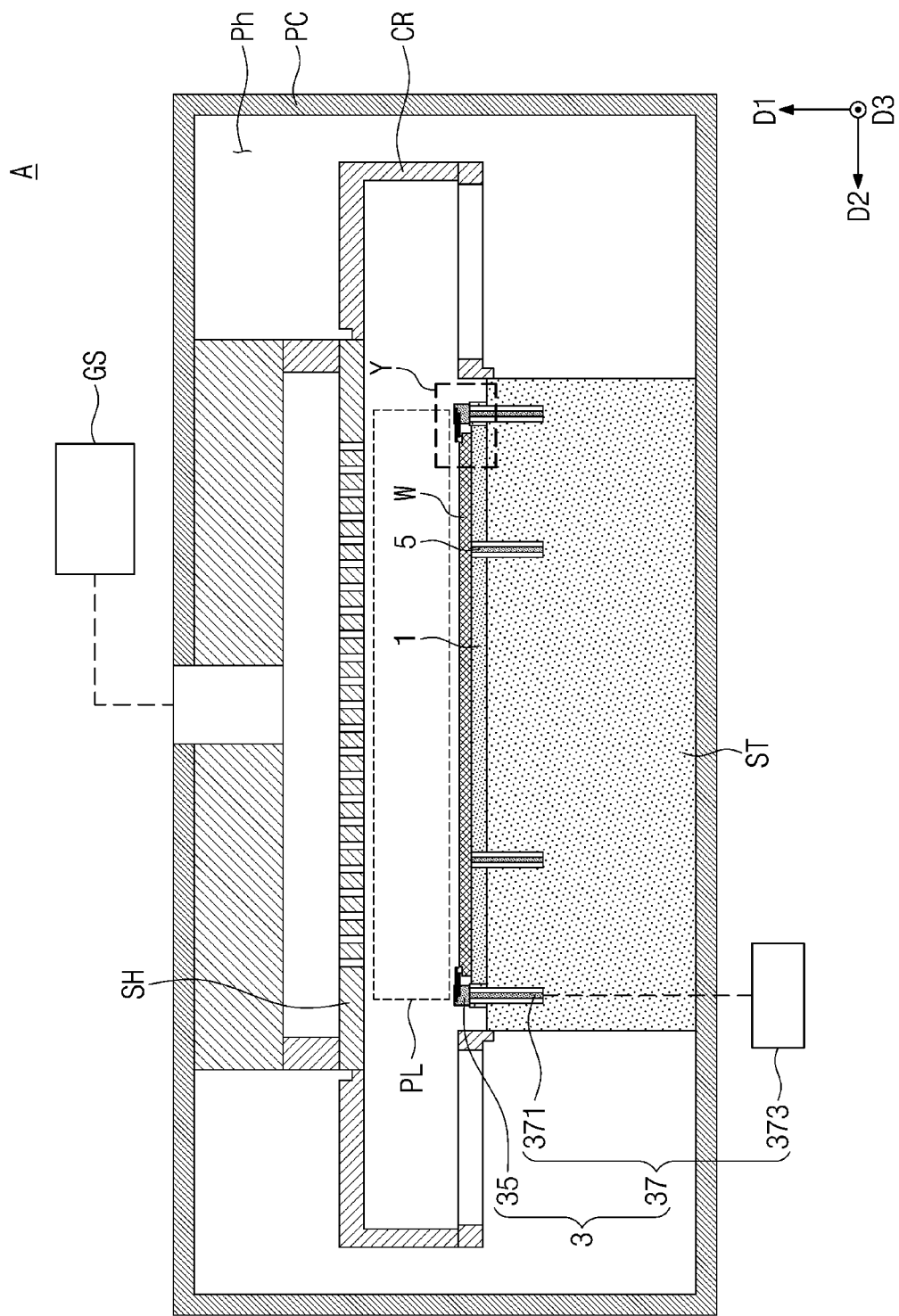

Referring to FIGS. 5B and 15, the plasma generation operation Sb3 may include converting a portion of the process gas (see PG of FIG. 14) into plasma PL. For example, when a radio-frequency (RF) power is applied to a bottom electrode in the stage ST, an electric field may be generated in the process space Ph on the wafer W. The electric field may convert a portion of the process gas PG into the plasma PL.

Figure 16:
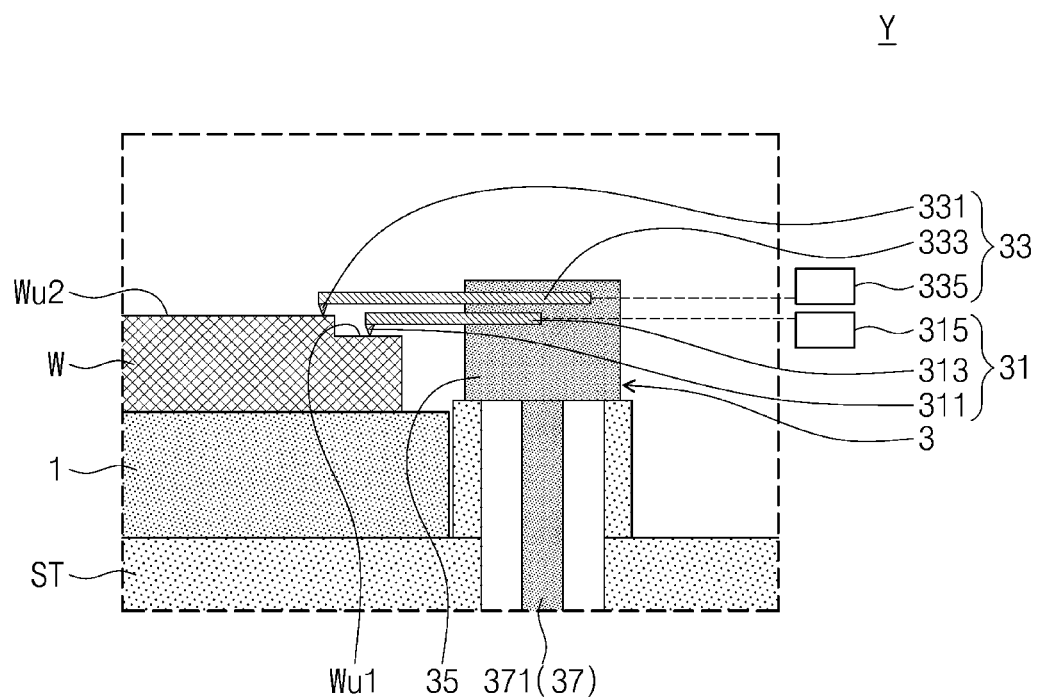

Referring to FIGS. 5B and 16, the first voltage apply operation Sb41 may include allowing the first voltage application part 31 to apply a first voltage to one side of the wafer W. For example, the first voltage delivery member 311 may apply the first voltage to the wafer W, while being in contact with one side top surface Wu1 of the wafer W. The first voltage generated from the first voltage source 315 may be transmitted to the wafer W through the first support member 313 and the first voltage delivery member 311. The second voltage apply operation Sb42 may include allowing the second voltage application part 33 to apply a second voltage to another side of the wafer W. For example, the second voltage delivery member 331 may apply the second voltage to the wafer W, while being in contact with another side top surface Wu2 of the wafer W. The second voltage generated from the second voltage source 335 may be transmitted to the wafer W through the second support member 333 and the second voltage delivery member 331. The procedure mentioned above will be further discussed in detail with reference to FIGS. 17 and 18.

Figure 17:
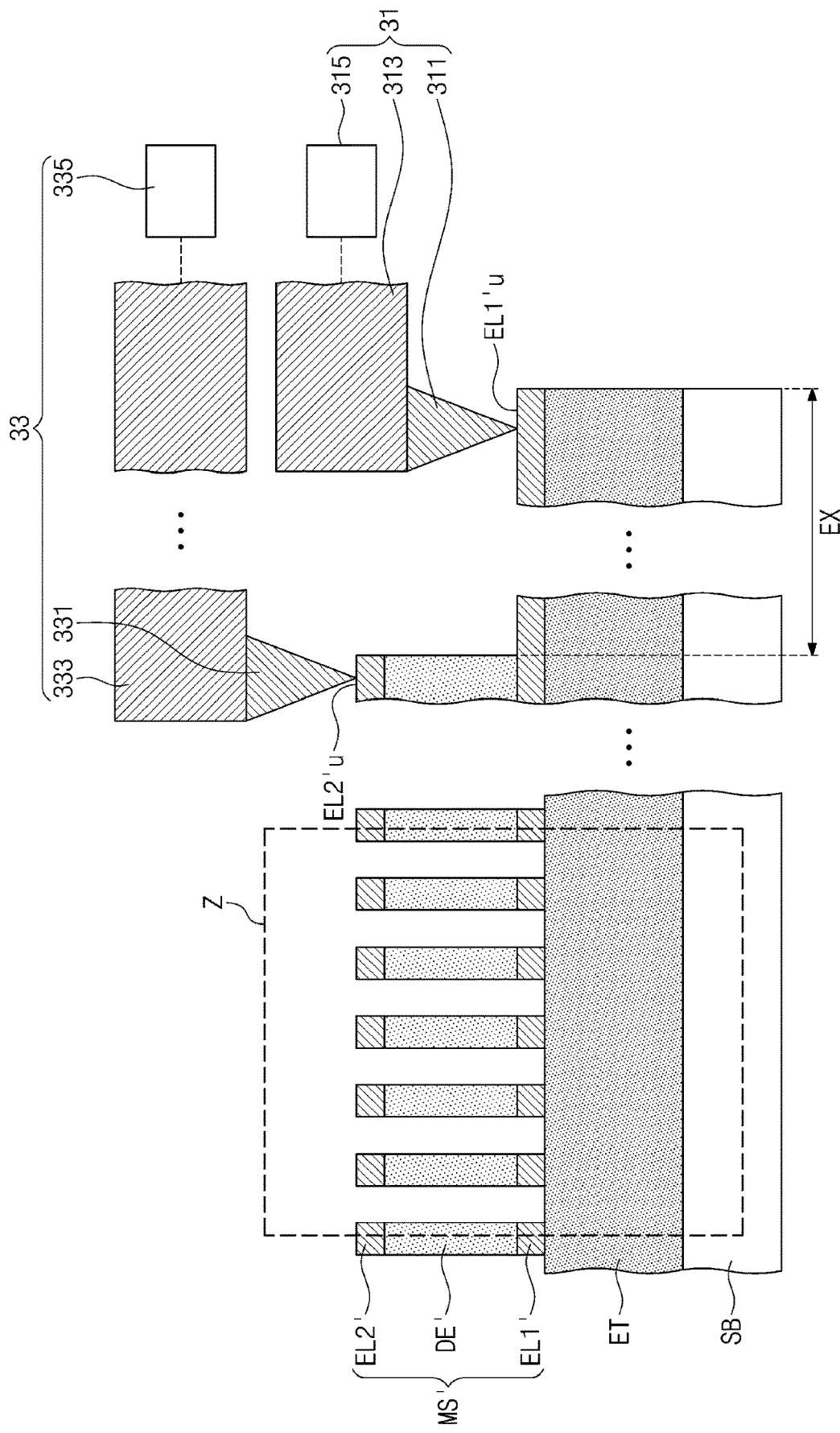

Referring to FIG. 17, the first voltage application part 31 may apply the first voltage to the first electrode layer EL1'. For example, on the exposure region EX, the first voltage delivery member 311 may apply the first voltage to the first electrode layer EL1', while being in contact with the exposed top surface EL1'u of the first electrode layer EL1'. In addition, the second voltage application part 33 may apply the second voltage to the second electrode layer EL2'. For example, inside the exposure region EX, the second voltage delivery member 331 may apply the second voltage to the second electrode layer EL2', while being in contact with a top surface EL2'u of the second electrode layer EL2'. As discussed above, the first voltage and the second voltage may each be a DC voltage.

Figure 18:
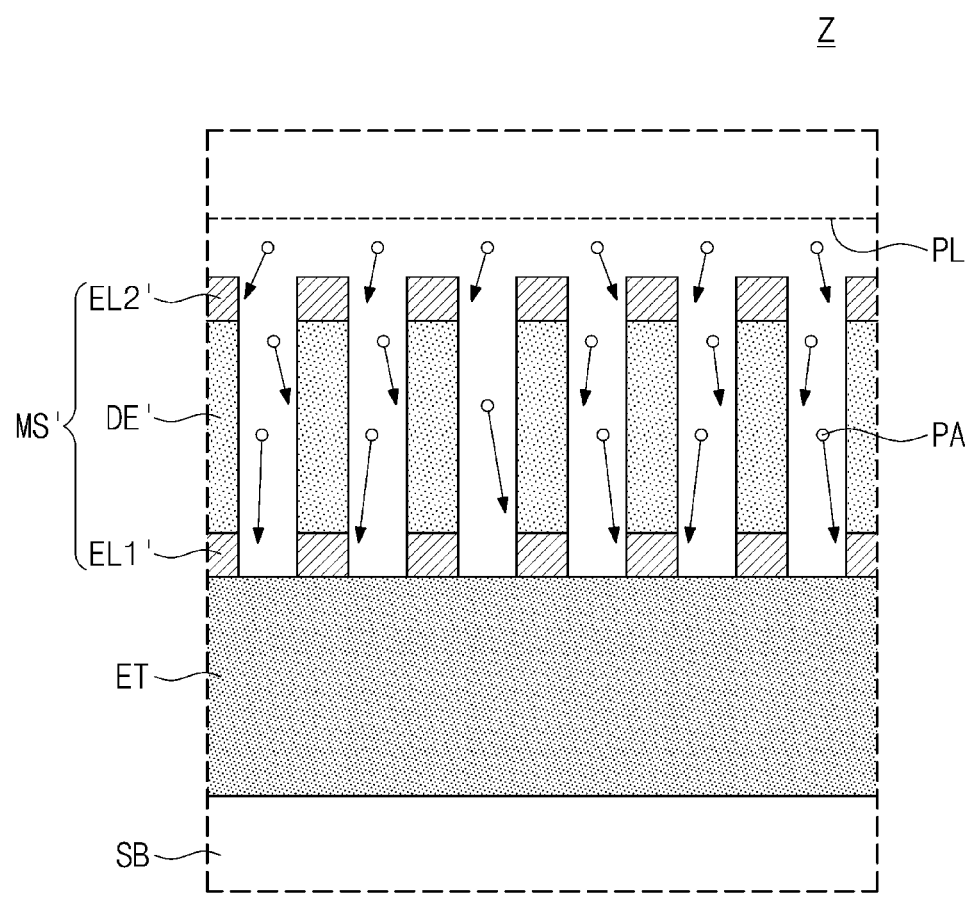

Referring to FIG. 18, particles PA of the plasma PL may pass through the pattern hole (see PTh of FIG. 10) to move toward the etch-target layer ET. The DC voltage applied to the first electrode layer EL1' and the second electrode layer EL2' may form an electric field between the first electrode layer EL1' and the second electrode layer EL2'. The particles PA of the plasma PL may include charged particles. For example, the particles PA of the plasma PL may include positively charged cations. The electric field may accelerate the particles PA of the plasma PL. For example, when the particles PA of the plasma PL enter the pattern hole PTh of the mask layer MS', the electric filed may compel the particles PA of the plasma PL to accelerate toward the substrate SB. Therefore, a downward speed of the particle PA in the pattern hole PTh of the mask layer MS' may be greater than a downward velocity of the particle PA above the mask layer MS'. Therefore, the particles PA may rapidly migrate downwards. The particles PA may collide with the etch-target layer ET at high speeds. The etch-target layer ET may be etched by high-speed collision of the particles PA.

Figure 19:
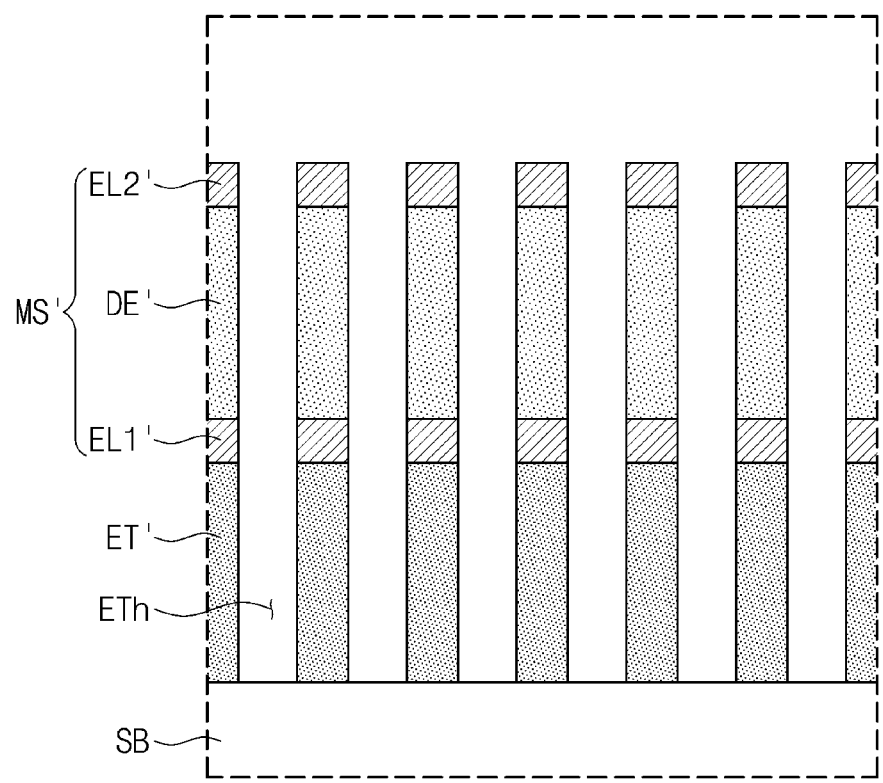

Referring to FIG. 19, a patterned etch-target layer ET' may be formed by being etched with the particles (see PA of FIG. 18) that are accelerated by the electric field. For example, the etch-target layer ET may be etched into the patterned etch-target layer ET' so as to form an etch hole ETh that vertically extends.

Figure 20:
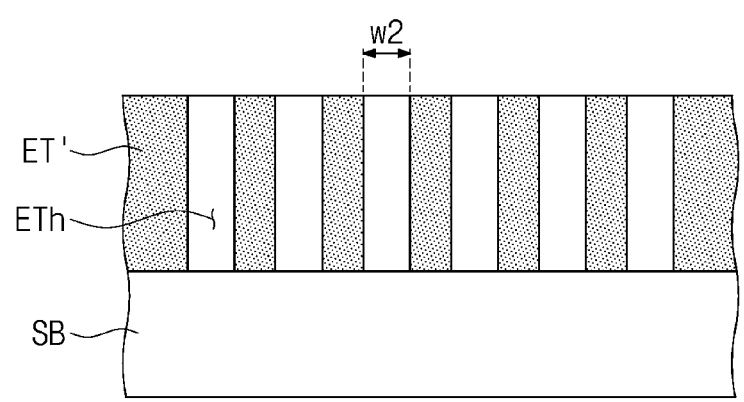

Referring to FIGS. 5A and 20, the removal operation Sa6 may include removing the mask layer (see MS' of FIG. 19) while leaving the patterned etch-target layer ET'. A diameter w2 of the etch hole ETh may be similar to the diameter w1 of the pattern hole (see PTh of FIG. 10). For example, the diameter w2 of the etch hole ETh may be about 70% to about 130% of the diameter w1 of the pattern hole PTh.

According to a plasma etching apparatus, a plasma etching method using the same, and a semiconductor fabrication method using the same in accordance with some embodiments of the present disclosure, an electric field may be formed by applying a DC voltage to an electronic layer of a mask layer. Therefore, it may be possible to accelerate plasma particles that pass through a pattern hole of the mask layer. Therefore, an etch-target layer may be effectively etched. For example, the etch-target layer may be etched much deeper. Accordingly, it may be possible to perform a high-aspect ratio contact (HARC) etching.

According to a plasma etching apparatus, a plasma etching method using the same, and a semiconductor fabrication method using the same in accordance with some embodiments of the present disclosure, a satisfactory etching may be possible even when the plasma particles migrate at low speeds. In this case, it may be possible to perform a HARC etching even in a low bias power. Therefore, it may be possible to reduce a speed of plasma particles that downwardly move toward the mask layer. In this sense, the mask layer may be prevented from being etched. When the mask layer is prevented from being etched, a diameter of the pattern hole may be prevented from being changed. Accordingly, the diameter of the pattern hole of the mask layer may maintain its optimum state during an etching process. In conclusion, there may be an increase in yield of an etching process on the etch-target layer.

In the embodiments that follow, omission will be made to avoid description of features substantially identical or similar to those discussed with reference to FIGS. 1 to 20.

Figure 21:
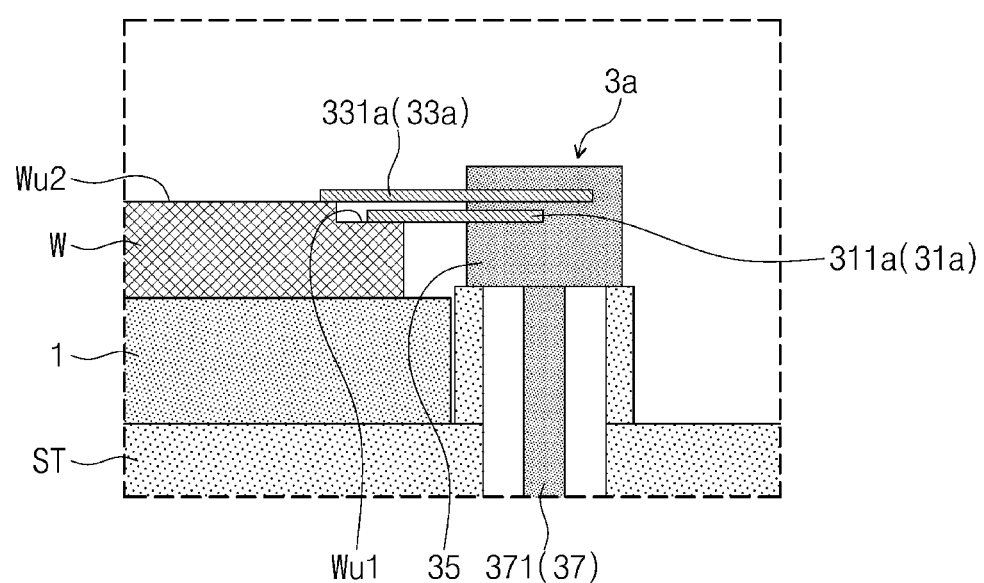
FIG. 21 is an enlarged cross-sectional view of a plasma etching apparatus according to an example embodiment.

FIG. 21 is an enlarged cross-sectional view of a plasma etching apparatus according to an example embodiment.

Referring to FIG. 21, a voltage application unit 3a may include a first voltage application part 31a and a second voltage application part 33a.

The first voltage application part 31a may include a first voltage delivery member 311a. The first voltage delivery member 311a may have a rod shape that extends in a horizontal direction. For example, differently from that discussed with reference to FIGS. 1 to 20, the first voltage delivery member 311a may have not the tip shape but the rod shape. The first voltage delivery member 311a may apply the first voltage to the one side top surface Wu1 of the wafer W. In this case, one side at a bottom surface of the first voltage delivery member 311a may be in contact with the one side top surface Wu1 of the wafer W.

The second voltage application part 33a may include a second voltage delivery member 331a. The second voltage delivery member 331a may have a rod shape that extends in a horizontal direction. For example, differently from that discussed with reference to FIGS. 1 to 20, the second voltage delivery member 331a may have not the tip shape but the rod shape. The second voltage delivery member 331a may apply the second voltage to the other side top surface Wu2 of the wafer W. In this case, another side at a bottom surface of the second voltage delivery member 331a may be in contact with the other side top surface Wu2 of the wafer W.

Figure 22:
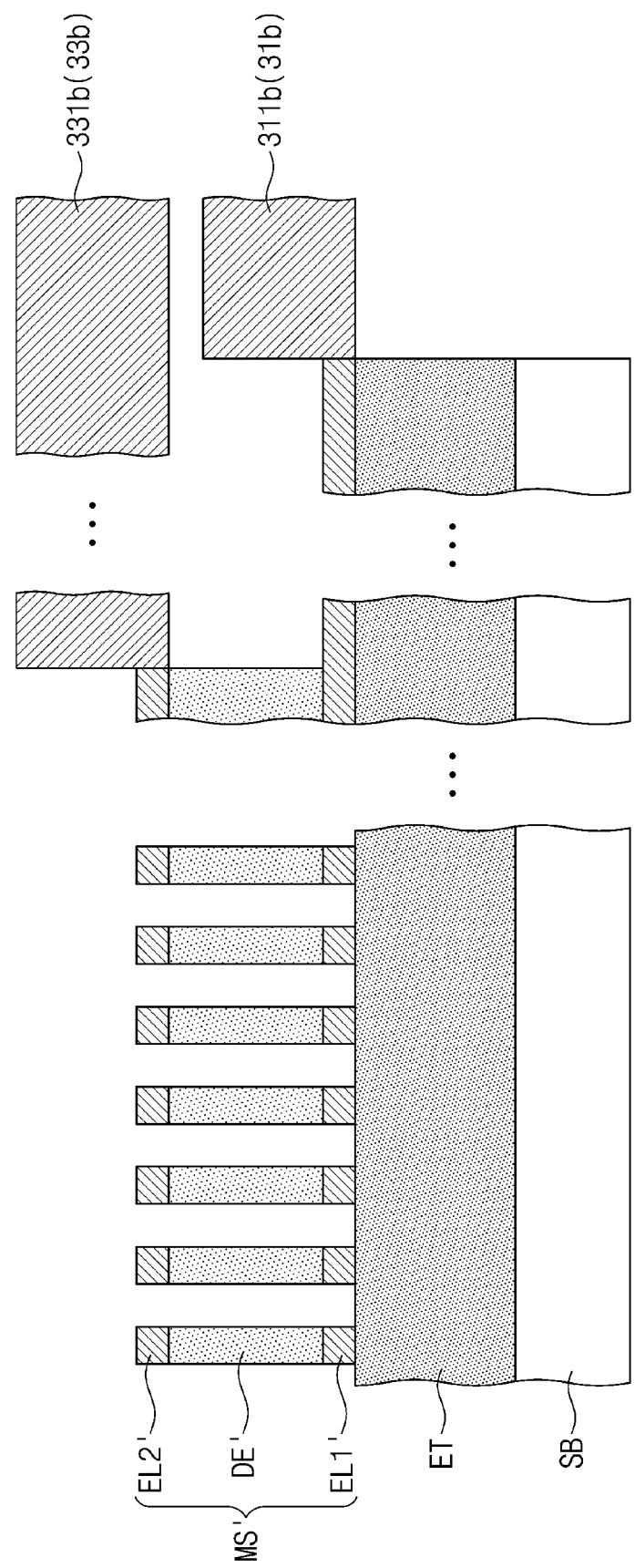
FIG. 22 is a cross-sectional view of a portion of a semiconductor fabrication method according to an example embodiment.

FIG. 22 is a cross-sectional view of a portion of a semiconductor fabrication method according to an example embodiment.

Referring to FIG. 22, a first voltage application part 31b may include a first voltage delivery member 311b. The first voltage delivery member 311b may have a rod shape that extends in a horizontal direction. The first voltage delivery member 311b may be in contact with a lateral surface of the first electrode layer EL1'. For example, the first voltage delivery member 311b may have a lateral surface in contact with the lateral surface of the first electrode layer EL1'. In a state where the first voltage delivery member 311b is in contact with the lateral surface of the first electrode layer EL1', the first voltage delivery member 311b may apply the first voltage to the first electrode layer EL1'.

A second voltage application part 33b may include a second voltage delivery member 331b. The second voltage delivery member 331b may have a rod shape that extends in a horizontal direction. The second voltage delivery member 331b may be in contact with a lateral surface of the second electrode layer EL2'. For example, the second voltage delivery member 331b may have a lateral surface in contact with the lateral surface of the second electrode layer EL2'. In a state where the second voltage delivery member 331b is in contact with the lateral surface of the second electrode layer EL2', the second voltage delivery member 331b may apply the second voltage to the second electrode layer EL2'.

Figure 23:
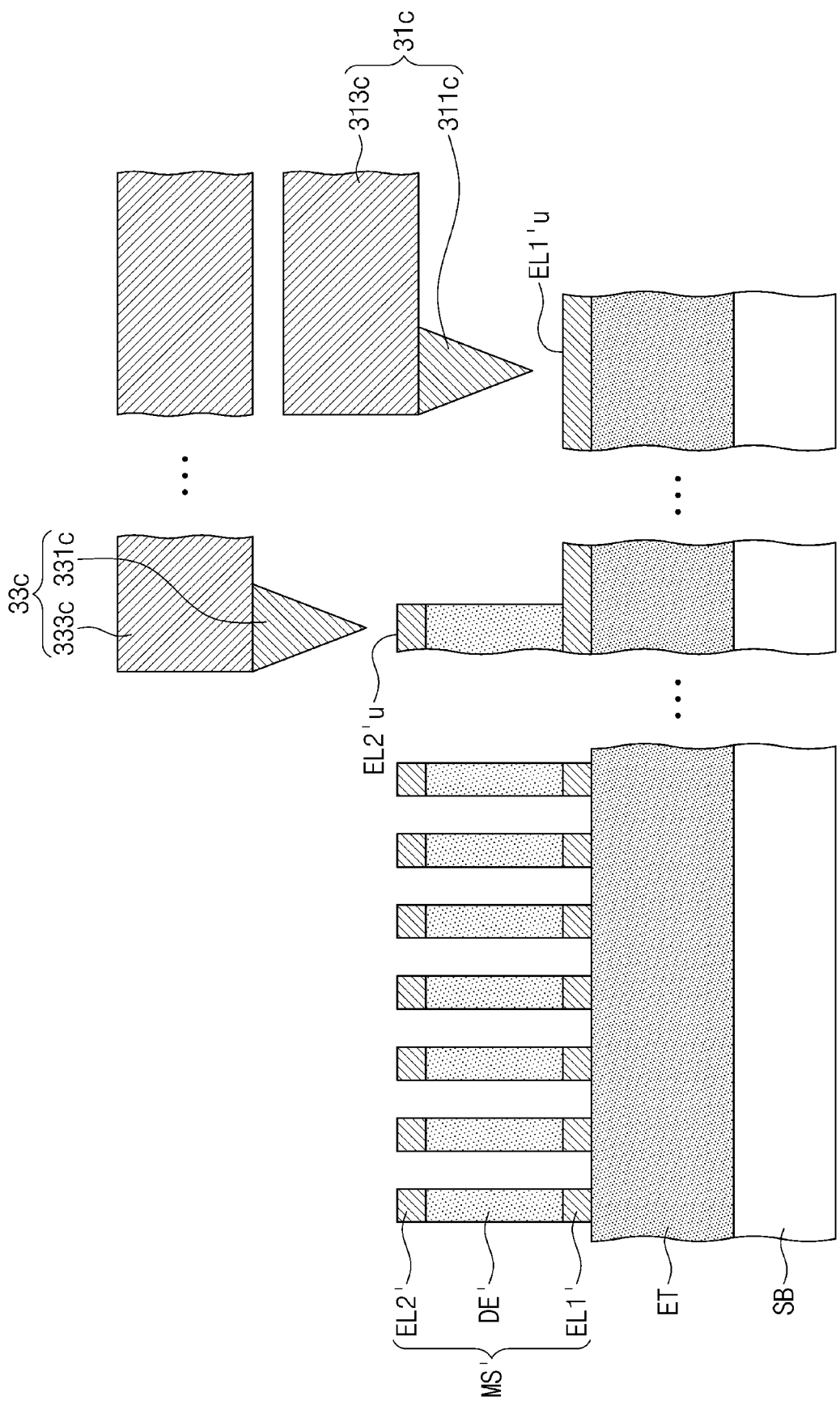
FIG. 23 is a cross-sectional view of a portion of a semiconductor fabrication method according to an example embodiment.

FIG. 23 is a cross-sectional view of a portion of a semiconductor fabrication method according to an example embodiment.

Referring to FIG. 23, in a non-contact state, a first voltage application part 31c may apply the first voltage to the first electrode layer EL1'. For example, in a state where a first voltage delivery member 311c is upwardly spaced apart from the top surface EL1'u of the first electrode layer EL1', the first voltage application part 31c may deliver the first voltage to the first electrode layer EL1'.

In a non-contact state, a second voltage application part 33c may apply the second voltage to the second electrode layer EL2'. For example, in a state where a second voltage delivery member 331c is upwardly spaced apart from the top surface EL2'u of the second electrode layer EL2', the second voltage application part 33c may deliver the second voltage to the second electrode layer EL2'.

According to a plasma etching apparatus, a plasma etching method using the same, and a semiconductor fabrication method using the same in accordance with some embodiments of the present disclosure, a DC voltage may be applied in a non-contact manner. Accordingly, a wafer may be prevented from damage that occurs when the wafer is contacted for applying the DC voltage.

Figure 24:
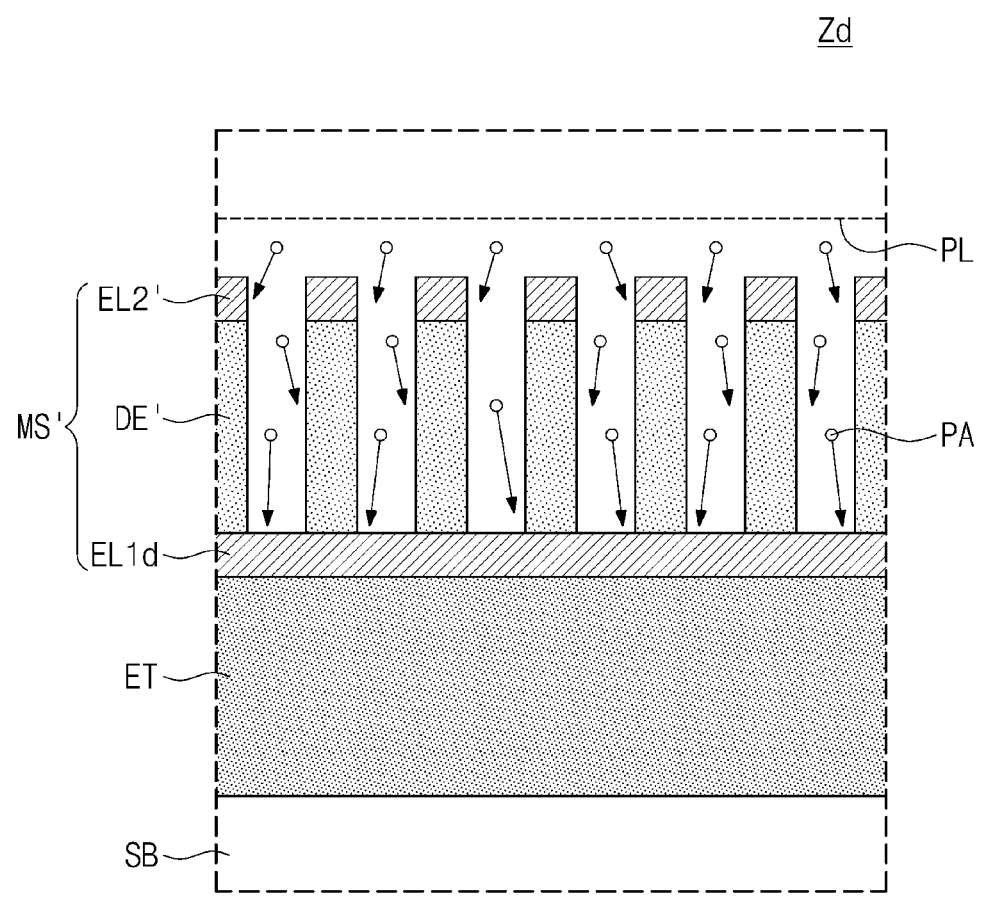
FIG. 24 is a cross-sectional view of a portion of a semiconductor fabrication method according to an example embodiment.

FIG. 24 is a cross-sectional view of a portion of a semiconductor fabrication method according to an example embodiment.

Referring to FIG. 24, when an etching process begins to etch the etch-target layer ET, the etch-target layer ET may have a top surface in a non-exposed state. For example, there may be a first electrode layer EL1d in a non-patterned state. The first voltage may be applied to the first electrode layer EL1d that is not patterned. An electric field generated between the first electrode layer EL1d and the second electrode layer EL2' may downwardly accelerate the particles PA of the plasma PL. The accelerated particles PA of the plasma PL may etch the first electrode layer EL1d and the etch-target layer ET.

Figure 25:
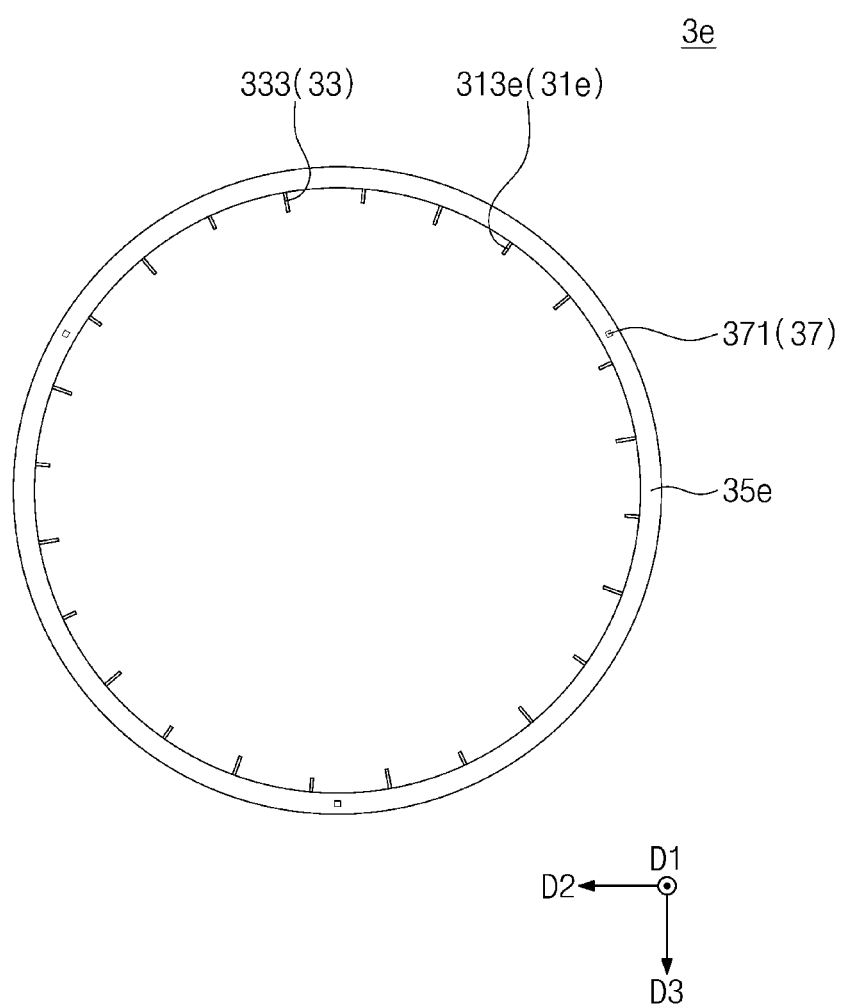
FIG. 25 is a plan view of a voltage application unit according to an example embodiment.

FIG. 25 is a plan view of a voltage application unit according to an example embodiment.

Referring to FIG. 25, a voltage application unit 3e may include a first voltage application part 31e and a second voltage application part 33.

The second voltage application part 33 may include a second support member 333. The second support member 333 may include a plurality of support members. The plurality of second support members 333 may be disposed spaced apart from each other in a circumferential direction.

The first voltage application part 31e may include a first support member 313e. The first support member 313e may include a plurality of support members. The plurality of first support members 313e may be disposed spaced apart from each other in the circumferential direction. The plurality of first support members 313e may be disposed spaced apart from the plurality of second support members 333. As illustrated in FIG. 25, when viewed in plan, the first support member 313e and the second support member 333 may not overlap each other.

According to a plasma etching apparatus, a plasma etching method using the same, and a semiconductor fabrication method using the same in accordance with some embodiments of the present disclosure, a first support member and a second support member may be disposed misaligned when viewed in plan. Therefore, a first voltage delivery member and a second voltage delivery member may not overlap each other when viewed in plan. A slight difference in level between a top surface of a first electrode layer and a top surface of a second electrode layer in a wafer. Thus, when the first and second voltage delivery members vertically overlap each other, the first and second voltage delivery members may interfere each other. In a case where the first and second voltage delivery members are disposed misaligned with each other, the interference may be prevented.

According to a plasma etching apparatus, a plasma etching method using the same, and a semiconductor fabrication method using the same, a mask layer may be prevented from being etched.

According to a plasma etching apparatus, a plasma etching method using the same, and a semiconductor fabrication method using the same, it may be possible to increase a yield in HARC etching.

According to a plasma etching apparatus, a plasma etching method using the same, and a semiconductor fabrication method using the same, it may be possible to perform a fine-pitch etching.

Effects of the present disclosure are not limited to the mentioned above, other effects which have not been mentioned above will be clearly understood to those skilled in the art from the following description.

Although the present disclosure has been described in connection with the embodiments illustrated in the accompanying drawings, it will be understood to those skilled in the art that various changes and modifications may be made without departing from the technical spirit and essential feature of the present disclosure. It therefore will be understood that the embodiments described above are illustrative but not limitative in all aspects.

What is claimed is:

1. A plasma etching apparatus comprising:
a chuck configured to support a wafer having a first upper surface at a first level and a second upper surface at a second level higher than the first level; and
a voltage application unit comprising:
a first voltage application part configured to contact the first upper surface of the wafer and apply a first voltage to the wafer on the chuck; and
a second voltage application part configured to contact the second upper surface of the wafer and apply a second voltage to the wafer on the chuck, the second voltage being different from the first voltage.

2. The plasma etching apparatus of claim 1, wherein the first voltage application part comprises a first voltage delivery member configured to transmit the first voltage to the first upper surface of the wafer on the chuck, and
wherein the second voltage application part comprises a second voltage delivery member configured to transmit the second voltage to the second upper surface of the wafer on the chuck.

3. The plasma etching apparatus of claim 2, wherein the first voltage delivery member comprises a plurality of first voltage delivery members, and
wherein the plurality of first voltage delivery members are spaced apart from each other in a circumferential direction.

4. The plasma etching apparatus of claim 3, wherein the voltage application unit further comprises an edge ring that supports the plurality of first voltage delivery members.

5. The plasma etching apparatus of claim 2, wherein the second voltage delivery member is provided above the chuck.

6. The plasma etching apparatus of claim 2, wherein a bottom end of the second voltage delivery member is provided above a bottom end of the first voltage delivery member.

7. The plasma etching apparatus of claim 2, wherein a first horizontal distance between the first voltage delivery member and an axis of the chuck is greater than a second horizontal distance between the second voltage delivery member and the axis of the chuck.

8. The plasma etching apparatus of claim 7, wherein the first horizontal distance is about 0.5 mm to about 5 mm greater than the second horizontal distance.

9. A plasma etching apparatus, comprising:
a chuck configured to support a wafer having a first upper surface at a first level and a second upper surface at a second level higher than the first level; and
a voltage application unit comprising:
a first voltage delivery member configured to contact the first upper surface of the wafer and transmit a first direct current (DC) voltage to the wafer;
a second voltage delivery member configured to contact the second upper surface of the wafer and transmit a second DC voltage to the wafer on the chuck, the second DC voltage being different from the first DC voltage; and
a first voltage source connected to the first voltage delivery member,
wherein the first voltage delivery member is provided above the chuck.

10. The plasma etching apparatus of claim 9, wherein the voltage application unit further comprises an elevation drive part configured to drive the first voltage delivery member to move vertically relative to the chuck.

11. The plasma etching apparatus of claim 10, wherein the elevation drive part comprises an outer lift pin that connects to the first voltage delivery member and that vertically extends.

12. The plasma etching apparatus of claim 11, wherein the first voltage delivery member comprises a plurality of first voltage delivery members that are spaced apart from each other in a circumferential direction,
wherein the voltage application unit further comprises an edge ring that supports the plurality of first voltage delivery members, and
wherein the outer lift pin is configured to move the edge ring vertically.

* * * * *